(12) United States Patent
Kouno et al.

(10) Patent No.: US 6,770,971 B2
(45) Date of Patent: Aug. 3, 2004

(54) SEMICONDUCTOR DEVICE AND METHOD OF FABRICATING THE SAME

(75) Inventors: Ichiro Kouno, Fussa (JP); Osamu Okada, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/458,920

(22) Filed: Jun. 10, 2003

(65) Prior Publication Data

US 2003/0230804 A1 Dec. 18, 2003

(30) Foreign Application Priority Data

Jun. 14, 2002 (JP) .......................................... 2002-173700
Nov. 11, 2002 (JP) .......................................... 2002-326304

(51) Int. Cl.[7] .............................................. H01L 23/48
(52) U.S. Cl. ...................... 257/734; 257/762; 257/737; 257/735; 257/758; 257/765; 257/787; 257/792; 257/793; 257/700; 257/713; 257/738; 438/127; 438/112; 438/108; 252/514
(58) Field of Search ................................. 257/734, 762, 257/737, 735, 758, 765, 787, 792, 793, 700, 713, 738; 252/514; 428/210; 438/127, 112, 108

(56) References Cited

U.S. PATENT DOCUMENTS

| | | | | |
|---|---|---|---|---|
| 6,338,893 B1 | * | 1/2002 | Kodera et al. | 428/210 |
| 6,372,158 B1 | * | 4/2002 | Hashimoto et al. | 252/514 |
| 6,501,169 B1 | | 12/2002 | Aoki et al. | |
| 2002/0158345 A1 | * | 10/2002 | Hedler et al. | 257/786 |
| 2002/0191406 A1 | * | 12/2002 | Hashitani et al. | 362/458 |

* cited by examiner

Primary Examiner—Matthew Smith
Assistant Examiner—B V Keshavan
(74) Attorney, Agent, or Firm—Frishauf, Holtz, Goodman & Chick, P.C.

(57) ABSTRACT

A semiconductor device includes a semiconductor structure including a semiconductor substrate having an integrated circuit portion, and a plurality of connecting pads connected to the integrated circuit portion. A plurality of distributing lines are formed on the semiconductor structure, connected to the connecting pads, and have connecting pad portions. An encapsulating layer made of a resin is formed on the semiconductor structure and upper surface of the distributing lines. A copper oxide layer is formed on at least a surface of each of the distributing lines except for the connecting pad portion.

51 Claims, 36 Drawing Sheets

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Applications No. 2002-173700, filed Jun. 14, 2002; and No. 2002-326304, filed Nov. 11, 2002, the entire contents of both of which are incorporated herein by reference.

BACKGROUND OF THE INVENTION

1. Field of the Invention

The present invention relates to a semiconductor device having an encapsulating layer for covering a distributing line and a method of fabricating the same.

2. Description of the Related Art

FIG. 36 shows an example of a semiconductor device called a CSP (Chip Size Package). This semiconductor device has a silicon substrate 104. A plurality of connecting pads 105 made of aluminum are formed on a peripheral portion of the upper surface of the silicon substrate 104. A silicon oxide insulating layer 106 is formed on the connecting pads 105 except for their central portions and on the upper surface of the silicon substrate 104, and a polyimide protective layer 108 is formed on the insulating layer 106. The central portions of the connecting pads 105 are exposed through holes 107 formed in the insulating layer 106 and protective layer 108.

Distributing lines 110 are formed from the upper surfaces of the connecting pads 105 exposed through the holes 107 to predetermined portions of the upper surface of the protective layer 108. Each distributing line 110 is made up of a metal undercoating 110a and an upper metal layer 110b which is formed on the upper surface of the metal undercoating 110a and made of copper. Columnar electrodes 111 made of copper are formed on the upper surfaces of pad portions at the ends of the distributing lines 110. On the upper surfaces of the protective layer 108 and the distributing lines 110, an encapsulating layer 117 made of an organic resin such as an epoxy-based resin is formed such that the upper surface of the encapsulating layer 117 is leveled with the upper surfaces of the columnar electrodes 111. Solder balls 119 are formed on the upper surfaces of the columnar electrodes 111.

In the above conventional semiconductor device, the encapsulating layer 117 is adhered to that upper surface of the protective layer 108, which is not covered with the distributing lines 110, to the surfaces of the distributing lines 110, and to the outer surfaces of the columnar electrodes 119. The above-mentioned conventional reference describes that the distributing lines 110 and columnar electrodes 111 are made of copper, and the encapsulating layer 117 is formed by an organic resin such as an epoxy-based resin. As will be described later, a pressure cooker test reveals that the adhesion between the encapsulating layer 117 made of an organic resin such as an epoxy-based resin and the copper distributing lines 110 and copper columnar electrodes 111 is not necessarily satisfactory. If the adhesion between the encapsulating layer 117 and the distributing lines 110 and columnar electrodes 111 is insufficient, the encapsulating layer 117 easily peels off from the surfaces of the distributing lines 110 and the outer surfaces of the columnar electrodes 111, resulting in an unsatisfactory encapsulating effect.

BRIEF SUMMARY OF THE INVENTION

It is an object of the present invention to provide a semiconductor device and a method of fabricating the same by which the adhesion between an encapsulating layer and the surface of a distributing line and between the encapsulating layer and the outer surface of a columnar electrode increases.

According to an aspect of the present invention, there is provided a semiconductor device comprising a semiconductor structure including a semiconductor substrate having an integrated circuit portion, and a plurality of connecting pads connected to the integrated circuit portion, a plurality of distributing lines formed on the semiconductor structure, electrically connected to the connecting pads, and having connecting pad portions, and an encapsulating layer made of a resin, and formed on the semiconductor structure and upper surfaces of the distributing lines, wherein a copper oxide layer is formed on a surface of each of the distributing lines except for at least the connecting pad portions.

According to another aspect of the present invention, there is provided a fabrication method of a semiconductor device comprising preparing a semiconductor structure including a semiconductor substrate having an integrated circuit portion, and a plurality of connecting pads connected to the integrated circuit portion, forming, on the semiconductor structure, a plurality of distributing lines connected to the connecting pads and having connecting pad portions, forming a copper oxide layer on a surface except for at least the connecting pad portions of the distributing lines, and forming an encapsulating layer made of a resin on the semiconductor structure including upper surfaces of the distributing lines.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION (First Embodiment)

Figure 1:
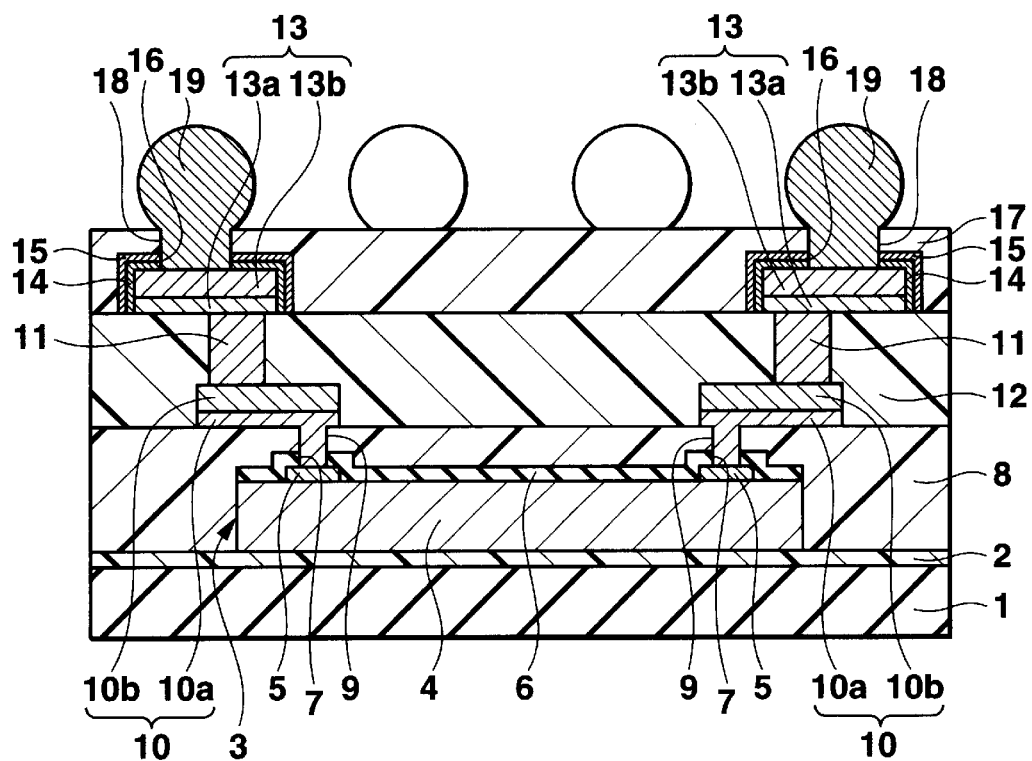
FIG. 1 is an enlarged sectional view of a semiconductor device according to the first embodiment of the present invention.

FIG. 1 is a sectional view showing a semiconductor device according to the first embodiment of the present invention. This semiconductor device includes a planar square base plate 1 made of, e.g., silicon, glass, ceramics, resin, or metal. On the upper surface of the base plate 1, an adhesive layer 2 made of, e.g., an adhesive, self-adhesive sheet, or double-coated adhesive tape is formed. The lower surface of a silicon substrate (semiconductor substrate) 4 of a planar square semiconductor structure 3 slightly smaller than the base plate 1 is adhered to a central portion of the upper surface of the adhesive layer 2.

A central portion of the upper surface of a silicon substrate 4 defines an integrated circuit region (not shown) in which an integrated circuit or circuits such as a storage circuit or control circuit are formed. In a peripheral portion of the upper surface of the silicon substrate 4 except for the integrated circuit region, a plurality of connecting pads 5 connected to predetermined elements in the integrated circuit region via lines (not shown) and made of an aluminum-based metal or the like are formed. Although a number of connecting pads 5 are formed on a silicon substrate 4, only a couple of connecting pad 5 are shown in FIG. 1 to simplify a drawing. The semiconductor structure 3 is usually called a semiconductor chip. The semiconductor structure 3 has the silicon substrate 4 having a semiconductor circuit region, the connecting pads 5 formed on the upper surface of the silicon substrate 4, and an insulating layer 6 covering the entire upper surface of the silicon substrate 4 and having holes 7 which expose central portions of the connecting pads 5.

A first insulating layer 8 (lower insulating layer) made of, e.g., polyimide or an epoxy-based resin is formed on the upper surface of the adhesive layer 2 and on the upper surface of the semiconductor structure 3. Holes 9 are formed in those portions of the first insulating layer 8, which correspond to the holes 7 in the insulating layer 6. From the upper surface of each connecting pad 5 exposed through the holes 7 and 9 to predetermined portion of the upper surface of the first insulating layer 8, a first upper distributing line 10 made up of a first metal undercoating 10a and a first upper metal layer 10b formed on the first metal undercoating 10a is formed. For example, the first metal undercoating 10a has a two-layered structure including a titanium layer and a copper layer on the titanium layer. The first upper metal layer 10b is made of a copper layer alone.

Columnar electrodes 11 made of copper are formed on the upper surfaces of connecting pad portions of the first upper distributing lines 10. On the upper surface of the first insulating layer 8 and on the upper surfaces of the first upper distributing lines 10, a second insulating layer 12 made of, e.g., polyimide or an epoxy-based resin is formed such that the upper surface of the second insulating layer 12 is leveled with the upper surfaces of the columnar electrodes 11. Accordingly, the upper surfaces of the columnar electrodes 11 are exposed from the second insulating layer 12.

From the upper surface of each columnar electrode 11 to predetermined portion of the upper surface of the second insulating layer 12, a second upper distributing line 13 made up of a second metal undercoating 13a and a second upper metal layer 13b formed on the second metal undercoating 13a is formed. The second metal undercoating 13a also has a two-layered structure including a titanium layer and a copper layer on the titanium layer. The second upper metal layer 13b is made of a copper layer alone.

On all the side surfaces exposed outside of the copper layer of the second metal undercoating 13a and on the surface (i.e., on the upper surface except for a certain portion which will be explained later and on all the side surfaces exposed outside) of the second upper metal layer 13b made of copper, a cupric oxide layer 14 is formed on the inside, and a cuprous oxide layer 15 is formed on the outside. A hole 16 which exposes a portion of the upper surface of the second upper metal layer 13b outside is formed through the cupric oxide layer 14 and cuprous oxide layer 15 covering the upper surface of each second upper distributing line 13. The portion of the second upper distributing line 13, which is exposed from the hole 16 forms a connecting pad portion.

On the upper surface of the second insulating layer 12 and on the upper surfaces of the cuprous oxide layers 15 covering the second upper distributing lines 13, a third insulating layer (encapsulating layer) 17 made of, e.g., polyimide or an epoxy-based resin is formed. Holes 18 are formed in those portions of the third insulating layer 17, which correspond to the connecting pad portions of the second upper distributing lines 13. In and above the holes 16 and 18, solder balls (low-melting metal) 19 are formed and electrically connected to the connecting pad portions of the second upper distributing lines 13. The solder balls 19 are arranged in a matrix manner on the third insulating layer 17.

The base plate 1 is made slightly larger than the semiconductor structure 3 in order to make the formation region of the solder balls 19 slightly larger than the planar size of the semiconductor structure 3 in accordance with an increase in number of the connecting pads 5 on the silicon substrate 4, thereby making the planar size and interval of the connecting pad portions of the second upper distributing lines 13 larger than the planar size and interval of the connecting pads 5 on the silicon substrate 4.

Accordingly, those connecting pad portions of the second upper distributing lines 13, which are arranged in a matrix manner are formed not only in a region corresponding to the semiconductor structure 3 but also in that region formed outside the side surfaces of the semiconductor structure 3, which corresponds to the first insulting layer 8. That is, of the solder balls 19 arranged in a matrix manner, at least outermost solder ball or balls 19 are formed in a peripheral portion outside the semiconductor structure 3.

Figure 2:
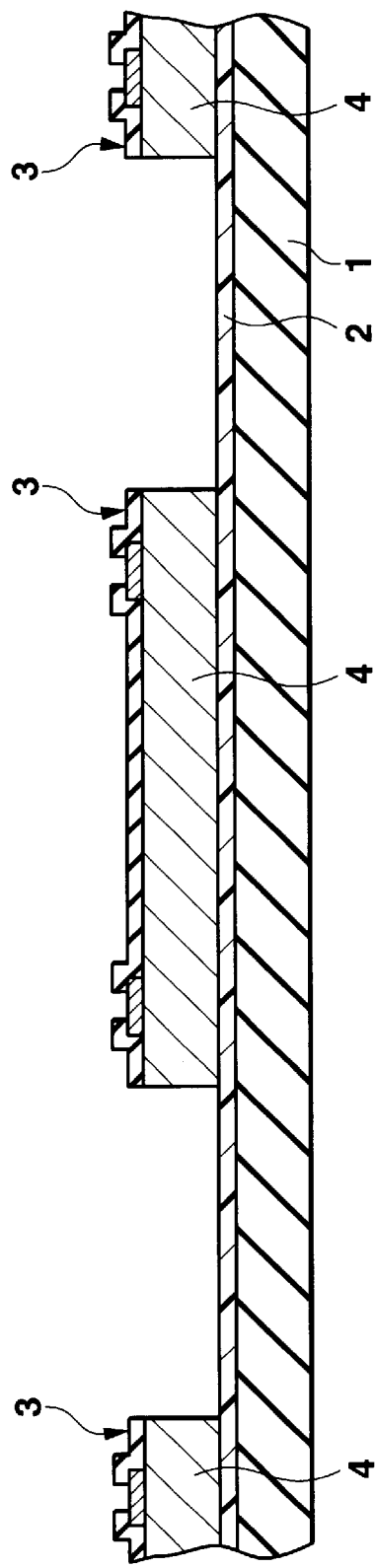
FIG. 2 is a sectional view of an initial fabrication step in the fabrication of the semiconductor device shown in FIG. 1.

An example of a method of fabricating this semiconductor device will be explained below. First, as shown in FIG. 2, an adhesive layer 2 is formed on the entire upper surface of a large base plate having a size from which a plurality of small base plates 1 can be obtained (this large base plate is denoted by the same reference numeral 1 as the small base plate for the sake of convenience). Then, the lower surfaces of silicon substrates 4 of semiconductor structures 3 are adhered to a plurality of predetermined portions of the upper surface of the adhesive layer 2.

Figure 3:
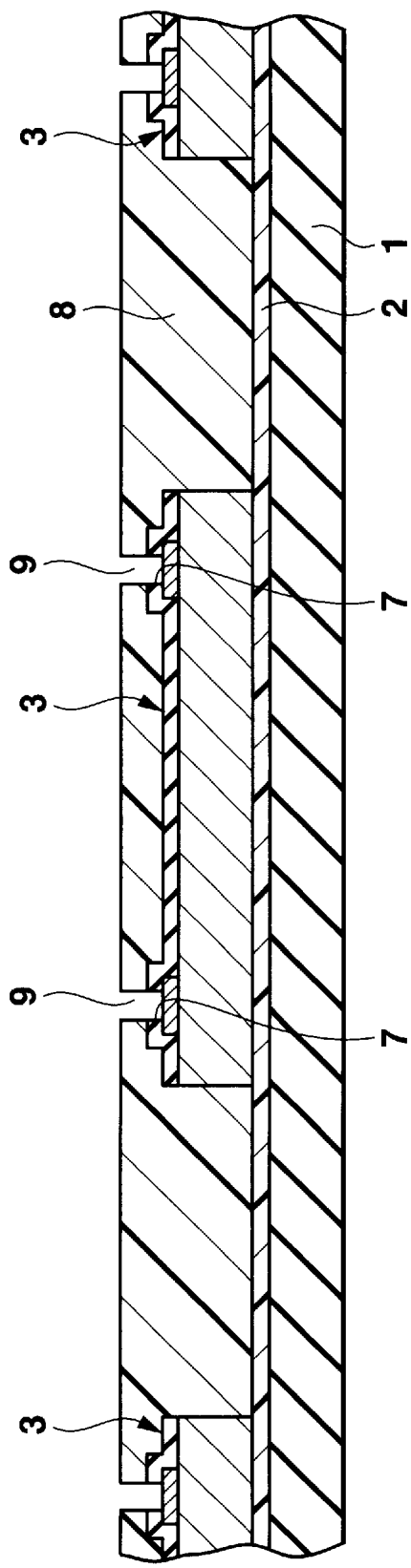
FIG. 3 is a sectional view of a fabrication step following FIG. 2.

Next, as shown in FIG. 3, a first insulating layer 8 made of, e.g., polyimide or an epoxy-based resin is formed on the upper surface of the adhesive layer 2 and on the semiconductor structures 3. In this state, the upper surface of the first insulating layer 8 is flat, and holes 9 are formed in those portions of the first insulating layer 8, which correspond to holes 7 in the semiconductor structures 3.

Figure 4:
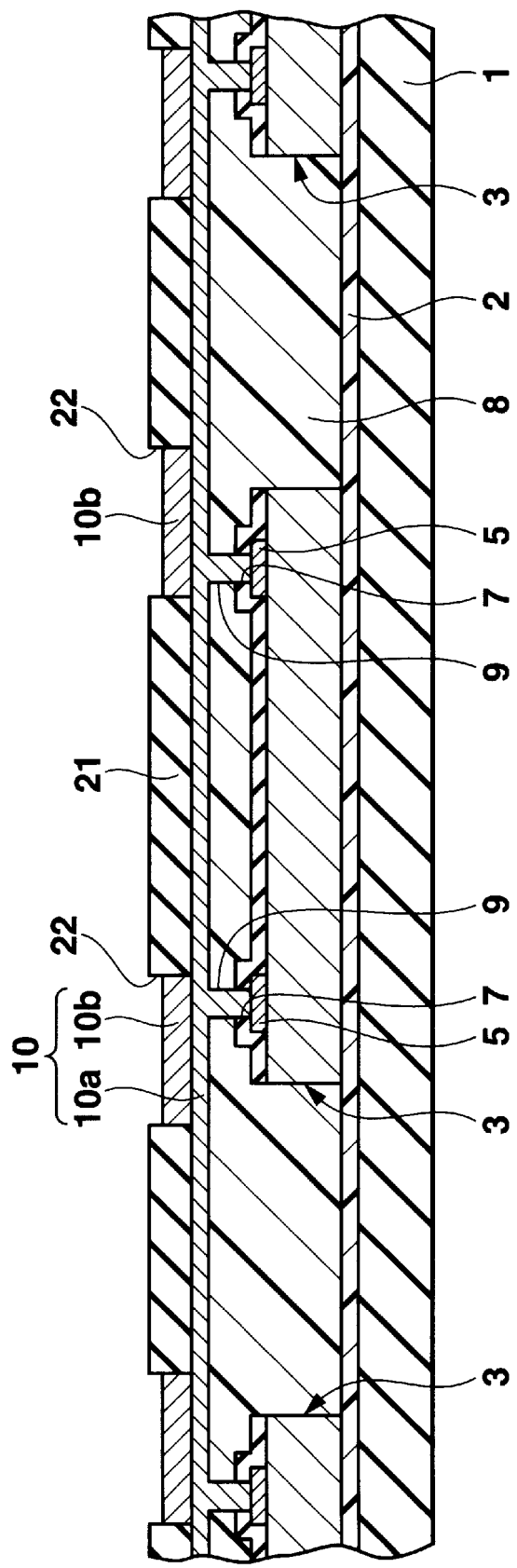
FIG. 4 is a sectional view of a fabrication step following FIG. 3.

As shown in FIG. 4, a first metal undercoating 10a is formed on the entire upper surface of the first insulating layer 8 and on the upper portions of connecting pods 5 exposed through the holes 7 and 9. For example, a layer forming first metal undercoatings 10a is obtained by forming a titanium layer by sputtering and forming a copper layer on this titanium layer by sputtering.

Subsequently, a known photolithography technique is used to form a plating resist layer 21 on the upper surface of the first metal undercoating 10a by patterning. In this state, holes 22 are formed in prospective regions of first upper distributing lines 10 by the patterning of the plating resist layer 21. The layer forming first metal undercoatings 10a is then used as a plating current path to perform electroplating of copper, thereby forming first upper metal layers 10b on the upper surfaces of those portions of the first metal undercoating 10a, which are exposed in the holes 22 of the plating resist layer 21. After that, the plating resist layer 21 is removed.

Figure 5:
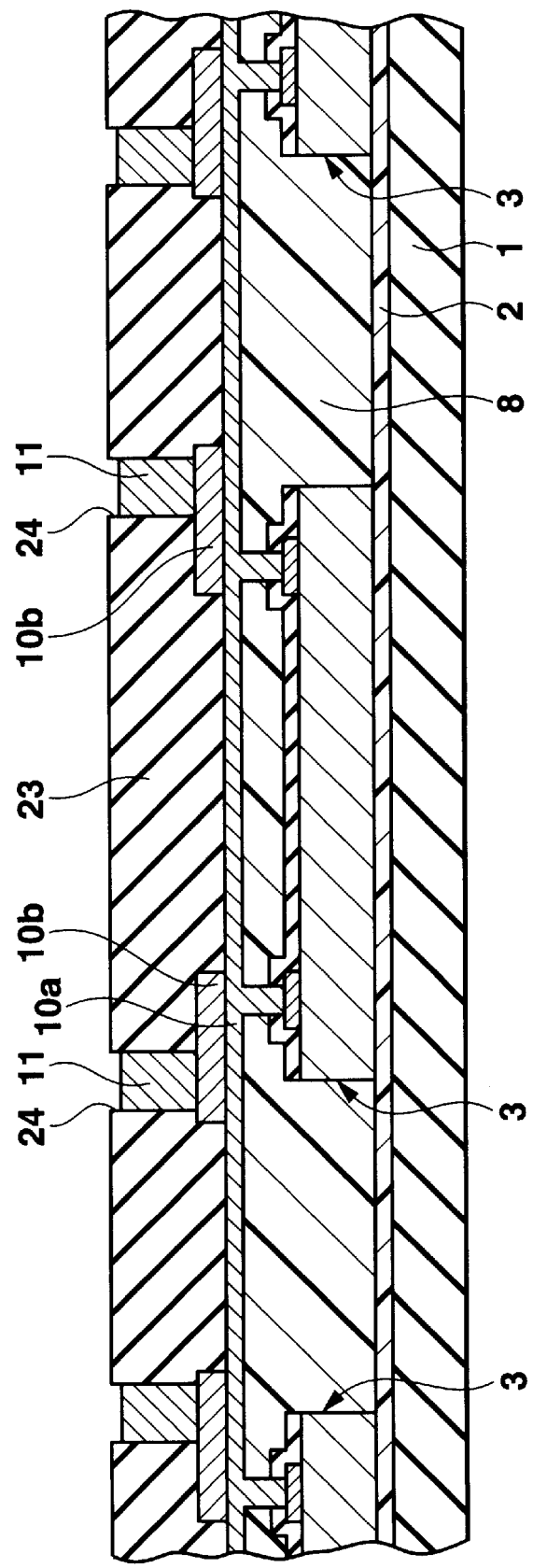
FIG. 5 is a sectional view of a fabrication step following FIG. 4.

As shown in FIG. 5, photolithography is used again to form a plating resist film 23 by patterning on the layer forming the first metal undercoatings 10a and on the upper surfaces of the first metal layers 10b. In this state, holes 24 are formed in regions corresponding to connecting pad portions of the first upper metal layers 10b by the patterning of the plating resist film 23. The layer forming the first metal undercoatings 10a is used as a plating current path to perform electroplating of copper, thereby forming columnar electrodes 11 on the upper surfaces of the connecting pad portions of the first upper metal layers 10b in the holes 24 of the plating resist film 23.

Figure 6:
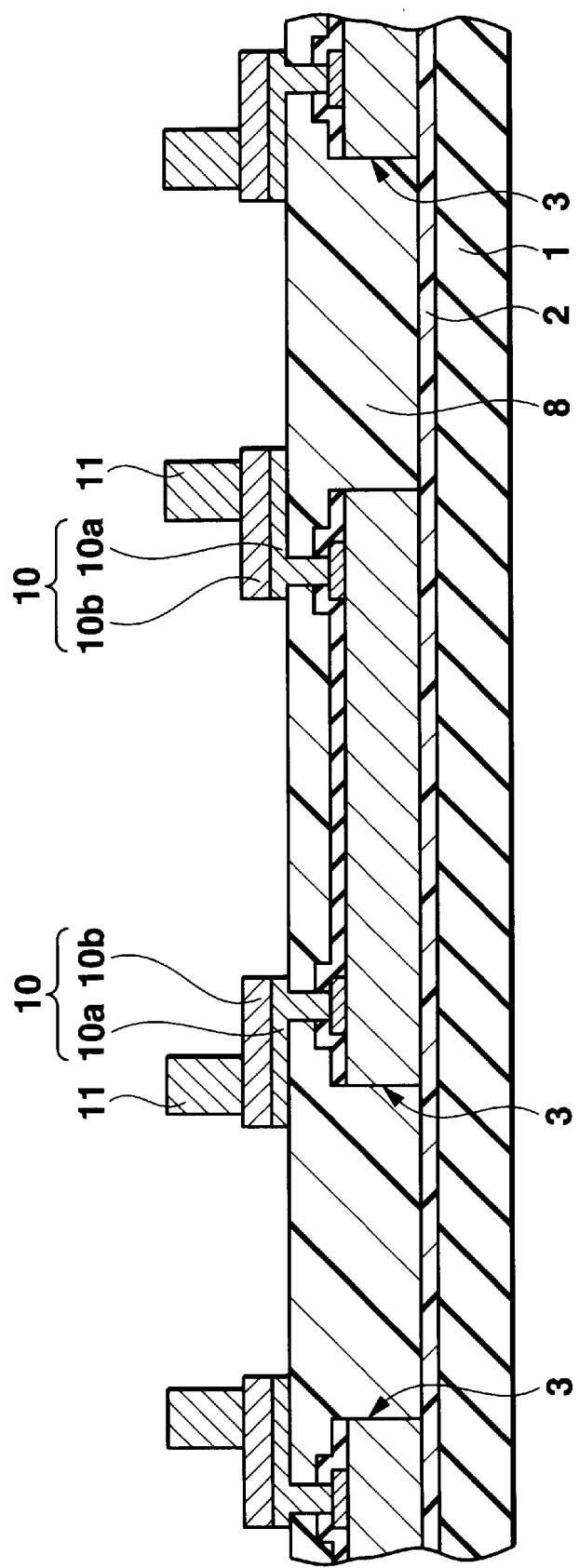
FIG. 6 is a sectional view of a fabrication step following FIG. 5.

After that, the plating resist film 23 is removed, and the columnar electrodes 11 and the first upper metal layers 10b are used as masks to etch away unnecessary portions (exposed portions) of the layer forming the first metal undercoatings 10a. Consequently, as shown in FIG. 6, the first metal undercoatings 10a remain only below the first upper metal layers 10b. First upper distributing lines 10 are formed by the first metal undercoatings 10a and the first upper metal layers 10b formed on the entire upper surfaces of the first metal undercoatings 10a.

Figure 7:
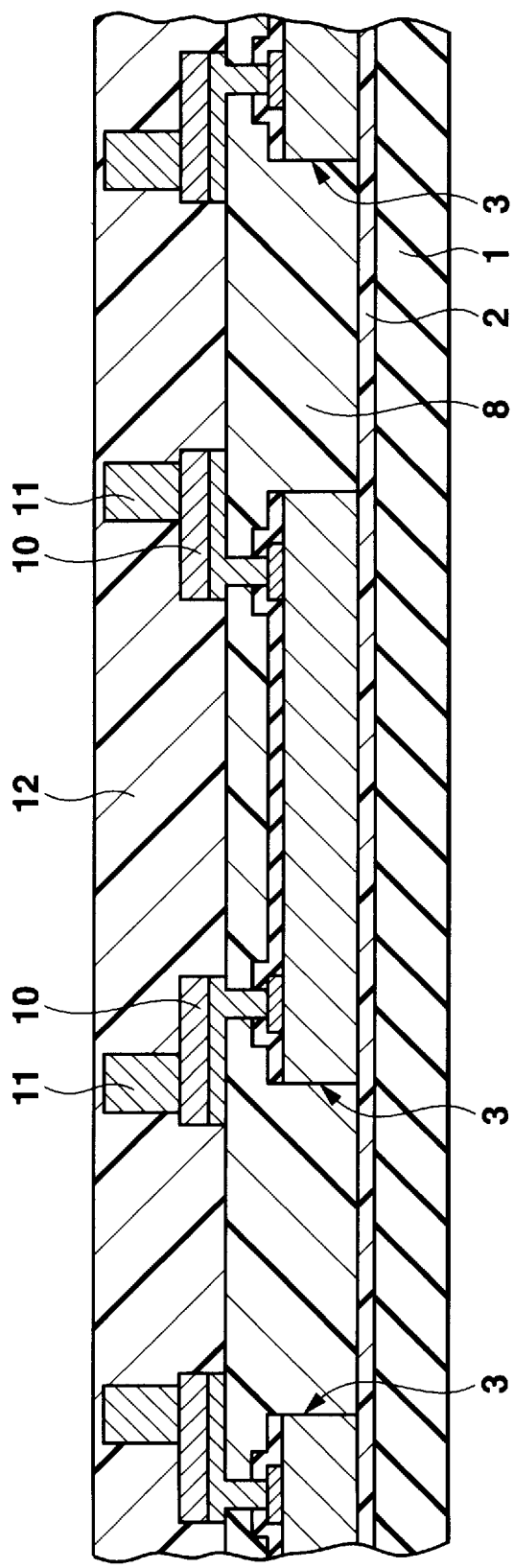
FIG. 7 is a sectional view of a fabrication step following FIG. 6.
Figure 8:
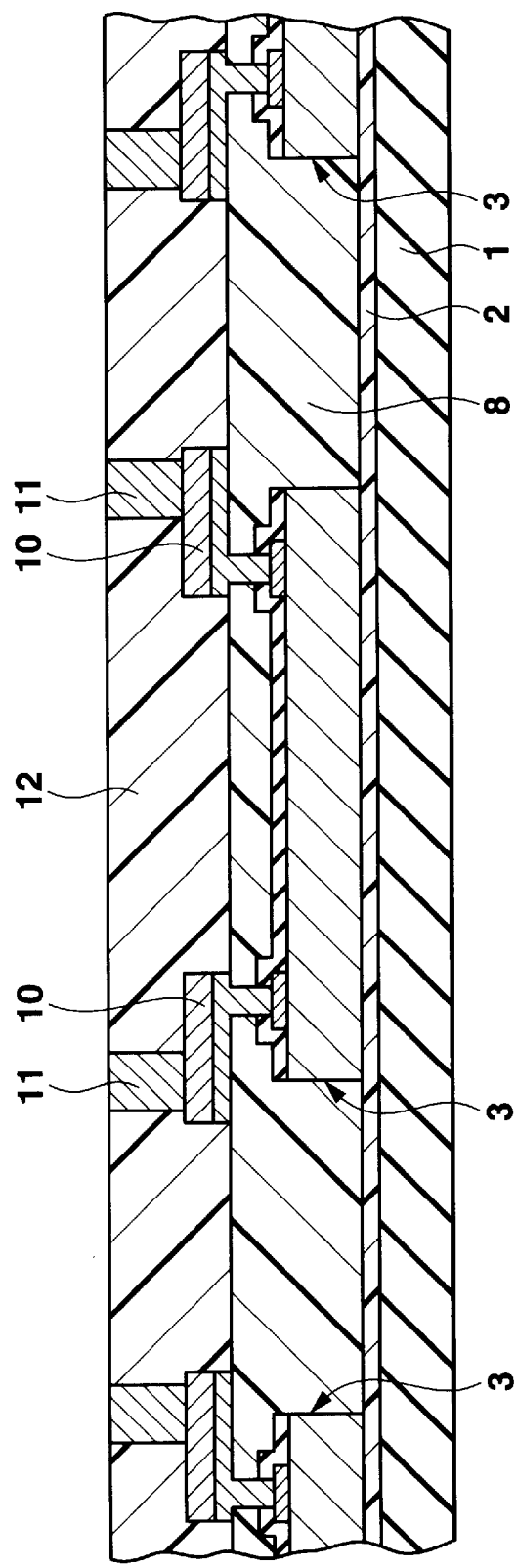
FIG. 8 is a sectional view of a fabrication step following FIG. 7.

As shown in FIG. 7, on the upper surface of the first insulating layer 8 and on the upper surfaces of the columnar electrodes 11 and first upper distributing lines 10, a second insulating layer 12 made of, e.g., polyimide or an epoxy-based resin is so formed as to have a thickness slightly larger than the height of the columnar electrodes 11. In this state, therefore, the upper surfaces of the columnar electrodes 11 are covered with the second insulating layer 12. Then, the second insulating layer 12 and the upper surfaces of the columnar electrodes 11 are appropriately polished. Consequently, as shown in FIG. 8, the upper surfaces of the columnar electrodes 11 are leveled with and exposed from the second insulating layer 12.

Figure 9:
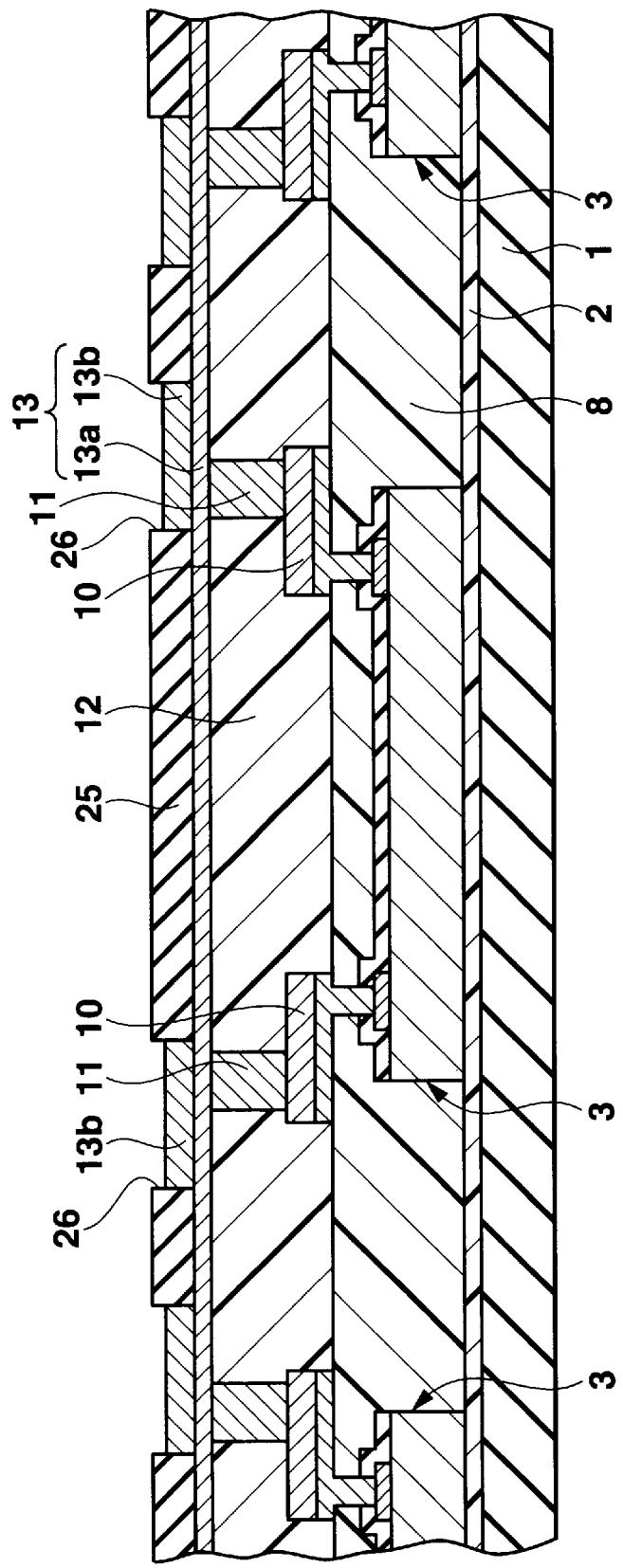
FIG. 9 is a sectional view of a fabrication step following FIG. 8.

As shown in FIG. 9, a layer forming second metal undercoatings 13a is formed on the entire upper surface of the second insulating layer 12 and on the upper surfaces of the columnar electrodes 11. For example, the layer forming the second metal undercoatings 13a is obtained by forming a titanium layer by sputtering and forming a copper layer on this titanium layer by sputtering.

Subsequently, photolithography is used to form a plating resist layer 25 on the upper surface of the layer forming the second metal undercoatings 13a by patterning. This pattern of the plating resist layer 25 has holes 26 formed in regions corresponding to prospective regions of second upper distributing lines 13. The layer forming the second metal undercoatings 13a is used as a plating current path to perform electroplating of copper, thereby forming second upper metal layers 13b on the upper surfaces of the layer forming the second metal undercoatings 13a in the holes 26 of the plating resist layer 25.

Figure 10:
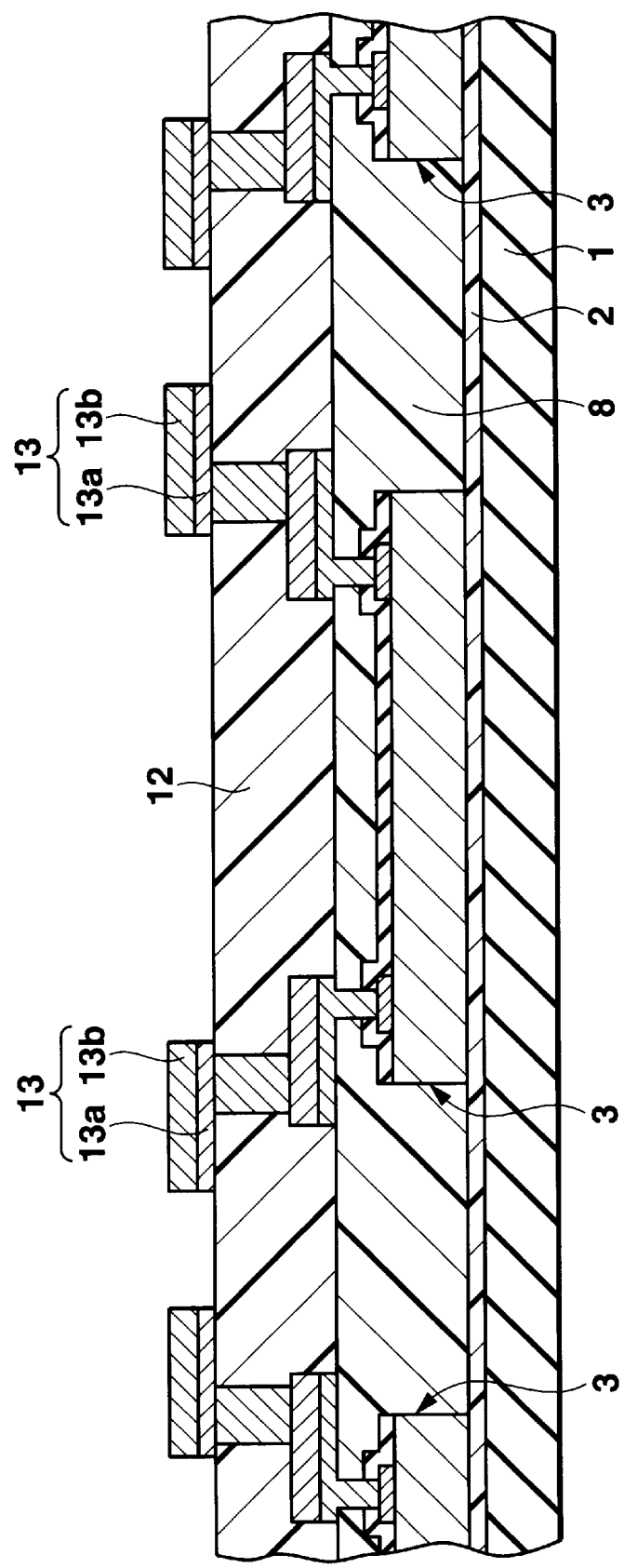
FIG. 10 is a sectional view of a fabrication step following FIG. 9.

After the plating resist layer 25 is removed, the second upper metal layers 13b are used as masks to etch away unnecessary portions of the layer forming the second metal undercoatings 13a. Consequently, as shown in FIG. 10, the second metal undercoatings 13a remain only below the second upper metal layers 13b. Second upper distributing lines 13 are formed by the remaining second metal undercoatings 13a and the second upper metal layers 13b formed on the entire surfaces of the second metal undercoatings 13a.

Examples of dimensions are as follows. The titanium layer thickness of the first and second metal undercoatings 10a and 13a is about 100 to 200 nm, and the copper layer thickness of these undercoatings is about 300 to 600 nm. The thickness of each of the first and second upper metal layers 10b and 13b is about 1 to 10 $\mu$m. The height of the columnar electrode 11 is about 100 to 150 $\mu$m.

Figure 11:
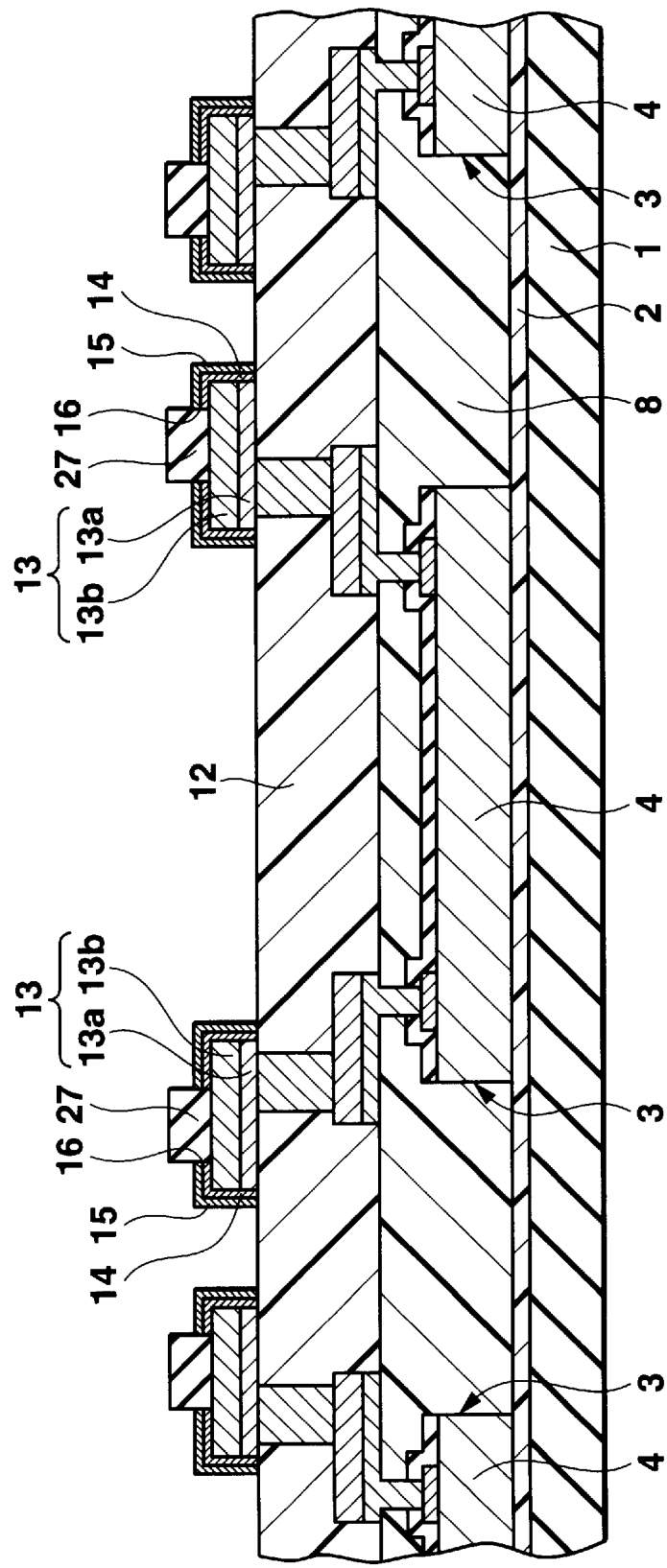
FIG. 11 is a sectional view of a fabrication step following FIG. 10.

Next, as shown in FIG. 11, a resist film 27 made of a dry layer or liquid photoresist is formed on the upper surface of a connecting pad portion of each second upper distributing line 13. As will be explained later, the resist film 27 is used as a mask to form an oxide layer on the side surfaces of the copper layer of each second metal undercoating 13a and on the surface of each second upper metal layer 13b made of copper. No oxide layer is formed on a portion of each second upper distributing line 13 where the resist film 27 is formed, so this portion functions as a connecting pad.

Two methods of forming the oxide layer will be explained below. The first method is to form a cupric oxide layer, and the second method is to form a cuprous oxide layer on the cupric oxide layer.

The first method of forming a cupric oxide layer will be described first.

After the resist film 27 is formed as described above, washing or the like is performed after the above fabrication step, i.e., the wet etching step of etching away unnecessary portions of the layer to form second metal undercoatings 13a by using the second upper metal layers 13b as masks. In this manner, natural copper oxide nonuniformly produced on the side surfaces of the copper layers of the second metal undercoatings 13a and on the surfaces of the second upper metal layers 13b is removed by dipping into sulfuric acid. Subsequently, washing and drying are performed to form a pure copper surface as the surface of each second upper distributing line 13.

Then, the silicon substrates 4 and the like are inserted together with a support jig into a chamber of an oven (not shown), and prebaking is performed in a nitrogen gas ambient at about 165° C. for about 45 min. This prebaking is performed so that the temperatures of parts such as the silicon substrates 4 and the support jig are evenly set at a preset temperature of about 165° C. Since the process is performed in a nitrogen gas ambient, no copper oxide is formed on the surfaces of the second upper distributing lines 13 and the like.

Subsequently, the prebaked silicon substrate 4 and the like are transferred into a chamber of a vacuum oven (not shown), and main baking is performed. In this main baking, the chamber is evacuated from the atmospheric pressure to about 133 Pa at a temperature of about 165° C., and dry air is supplied to restore the atmospheric pressure. This cycle is repeated three times. In addition, annealing is performed in the dry air ambient at about 165° C. for about 10 min. As a consequence, a cupric oxide layer 14 about 20 to 40 nm thick is formed on the side surfaces of the copper layer of the second metal undercoating 13a and on the surface of the second upper metal layer 13b. Note that 100% oxygen gas may also be used in place of the dry air.

Next, the second method of forming a cuprous oxide layer on the cupric oxide layer will be described below.

In this method, as in the above first method, after the resist film 27 is formed, washing or the like is performed after the above fabrication step, i.e., the wet etching step of etching away unnecessary portions of the layer to form second metal undercoatings 13a by using the second upper metal layers 13b as masks. In this manner, natural copper oxide nonuniformly produced on the side surfaces of the copper layers of the second metal undercoatings 13a and on the surfaces of the second upper metal layers 13b is removed by dipping into sulfuric acid. Subsequently, washing and drying are performed to form a pure copper surface as the surface of each second upper distributing line 13.

Then, copper oxide is formed by using processing solutions. A first processing solution contains about 10 to 20 wt % of sodium hydroxide and about 80 to 90 wt % of pure water. A second solution contains about 15 to 25 wt % of sodium chlorite, about 70 to 80 wt % of pure water, and about 1 to 10 wt % of a stabilizer.

First, the base plate 1 and the like are dipped in a solution mixture of about 30 to 40 mL/L of the first processing solution and about 960 to 970 mL/L of pure water (the total of the two solutions is 1,000 mL/L) at room temperature for about 1 to 2 min. This dipping process is performed to adapt the second upper distributing lines 13 to a processing solution (solution mixture) in the next dipping process, and no copper oxide is formed on the surfaces of the second upper distributing lines 13.

Subsequently, the base plate 1 and the like are dipped in a solution mixture of about 50 mL/L of the first processing solution, about 450 mL/L of the second processing solution, and about 500 mL/L of pure water at about 55° C. for about 1 min. After that, water washing, hot water washing, and drying are performed. Consequently, a cupric oxide layer 14 about 50 to 500 nm thick is formed on the side surfaces of the copper layer of each second metal undercoating 13a and on the surface of each second upper metal layer 13b, and a cuprous oxide layer 15 about 10 to 100 nm thick is formed on the surface of the cupric oxide layer 14. Then, the resist film 27 is removed.

Figure 12:
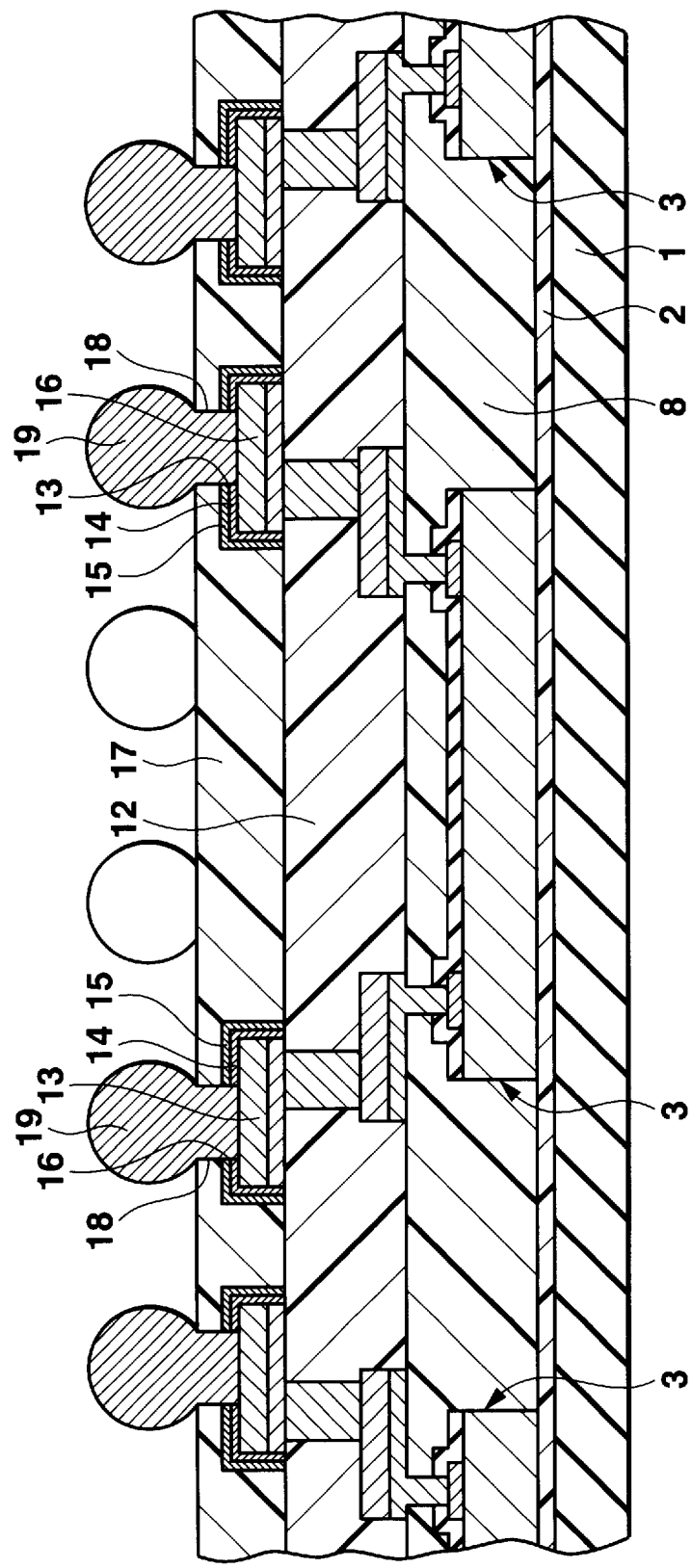
FIG. 12 is a sectional view of a fabrication step following FIG. 11.

Next, as shown in FIG. 12, photolithography is used to form a third insulating layer 17 made of, e.g., polyimide or an epoxy-based resin by patterning on the surface of the second insulating layer 12 and on the cupric oxide layers 14 and cuprous oxide layers 15 on the surfaces of the second upper distributing lines 13. In this state, holes 18 are formed in regions corresponding to those portions of the third insulating layer 17, which correspond to holes 16 in the cupric oxide layers 14 and cuprous oxide layers 15.

Figure 13:
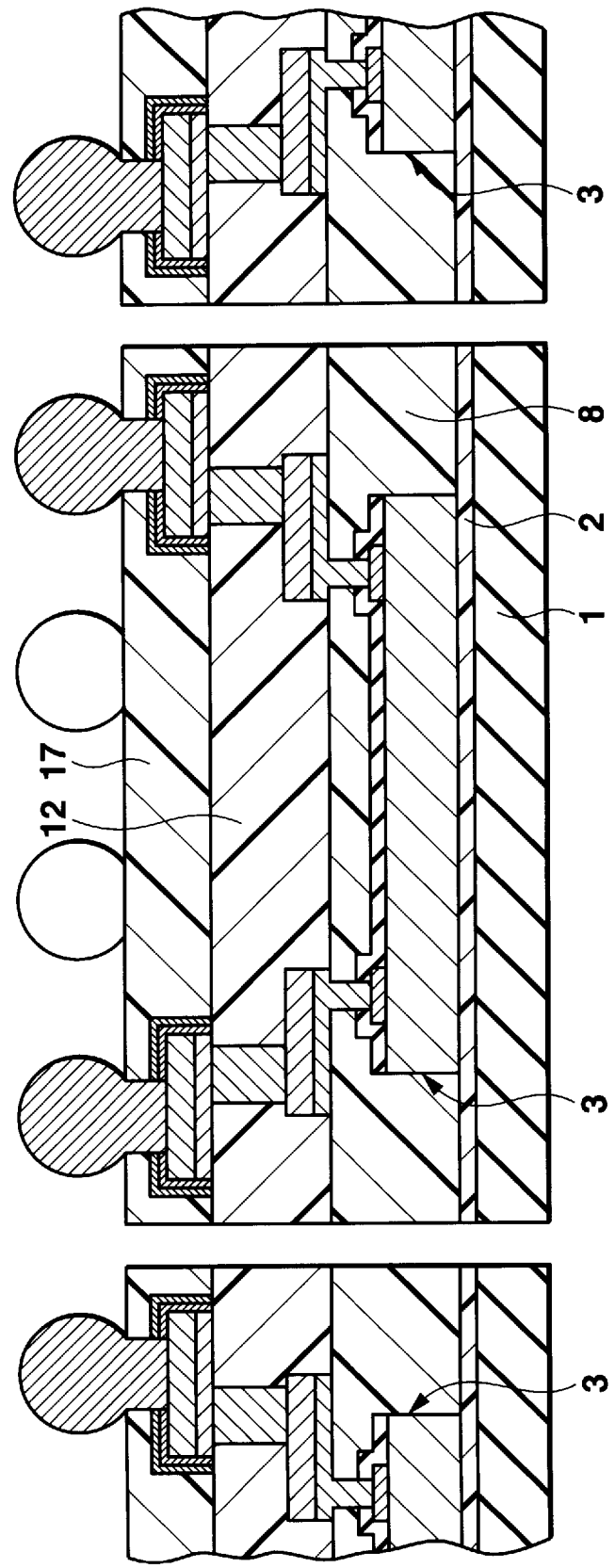
FIG. 13 is a sectional view of a fabrication step following FIG. 12.

Subsequently, solder balls 19 are formed in and above the holes 16 and 18 so as to be connected electrically and mechanically to the connecting pad portions of the second upper distributing lines 13. As shown in FIG. 13, the three insulating layers 17, 12, and 8, the adhesive layer 2, and the base plate 1 are cut between adjacent semiconductor structures 3 to obtain a plurality of semiconductor devices shown in FIG. 1.

The effect of the oxide layer will be described below on the basis of a shear strength test conducted by a pressure cooker test (PCT). First, a first sample shown in FIG. 33 and a second sample shown in FIG. 34 were prepared. The first sample had a structure in which a second semiconductor device 330 was adhered to a central portion of the upper surface of a first semiconductor device 230 via an insulating layer 217 made of an epoxy-based resin. The first semiconductor device 230 had a structure in which a polyimide protective layer 208, and a distributing line 213 made up of a two-layered metal undercoating 213a including a titanium layer and copper layer and an upper metal layer 213b made of copper were formed on a silicon substrate 204, and a cupric oxide layer 214 was formed on the side surfaces of the copper layer of the metal undercoating 213a and on the surface of the upper metal layer 213b. The second semiconductor device 330 had a structure in which a polyimide protective layer 308, and a distributing line 313 made up of a two-layered metal undercoating 313a including a titanium layer and copper layer and an upper metal layer 313b made of copper were formed below a silicon substrate 304, and a cupric oxide layer 314 was formed on the side surfaces of the copper layer of the metal undercoating 313a and on the surface of the upper metal layer 313b.

The second sample had a structure in which a second semiconductor device 330 was attached to a central portion of the upper surface of a first semiconductor device 230 via an insulating layer 217 made of an epoxy-based resin. The first semiconductor device 230 had a structure in which a polyimide protective layer 208, and a distributing line 213 made up of a two-layered metal undercoating 213a including a titanium layer and copper layer and an upper metal layer 213b made of copper were formed on a silicon substrate 204. A cupric oxide layer 214 was formed on the side surfaces of the copper layer of the metal undercoating 213a and on the surface of the upper metal layer 213b, and a cuprous oxide layer 215 was stacked on the cupric oxide layer 214. The second semiconductor device 330 had a structure in which a polyimide protective layer 308, and a distributing line 313 made up of a two-layered metal undercoating 313a including a titanium layer and copper layer, and an upper metal layer 313b made of copper were formed below a silicon substrate 304. A cupric oxide layer 314 was formed on the side surfaces of the copper layer of the metal undercoating 313a and on the surface of the upper metal layer 313b, and a cuprous oxide layer 315 was stacked on the cupric oxide layer 314.

Figure 35:
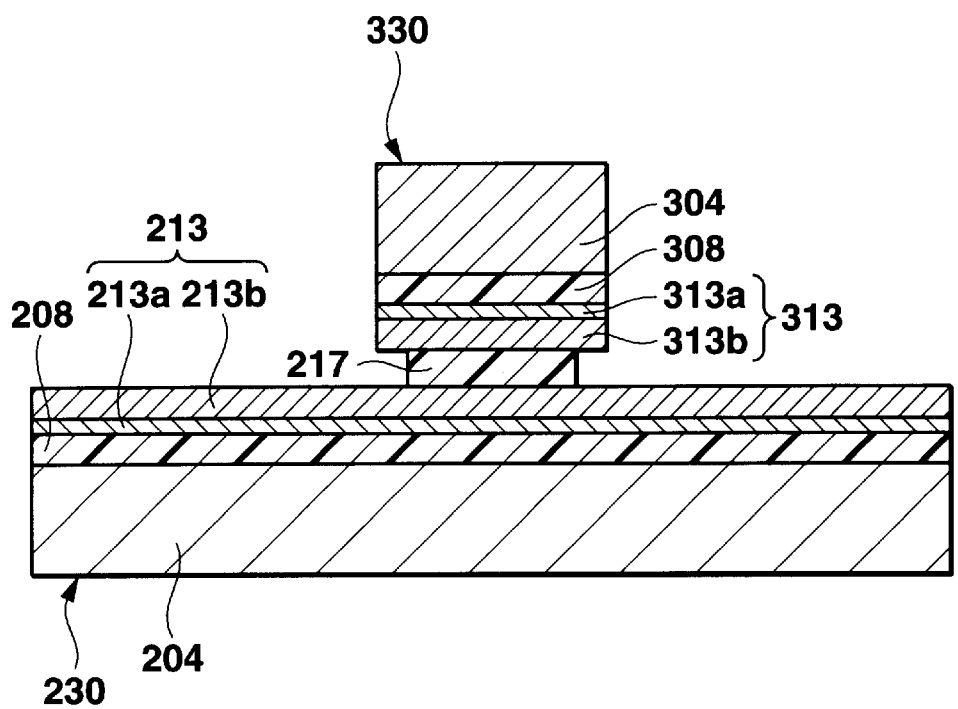
FIG. 35 is a sectional view of a comparative sample used in a shear strength test.
Figure 36:
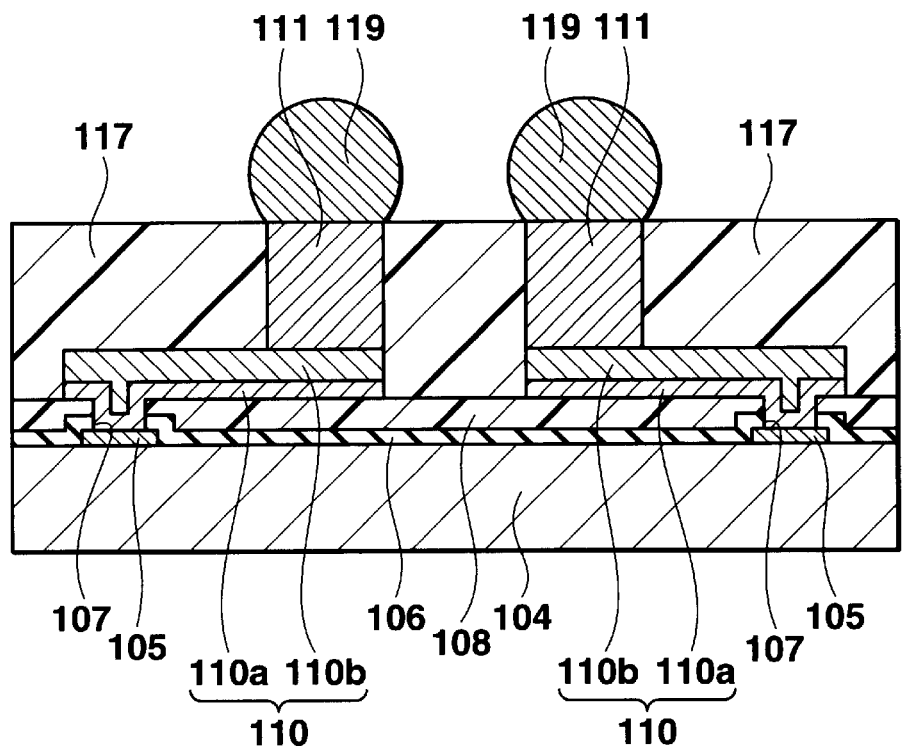
FIG. 36 is an enlarged sectional view of a conventional semiconductor device.

A comparative sample shown in FIG. 35 was also prepared. This comparative sample had a structure in which a second semiconductor device 330 was attached to a central portion of the upper surface of a first semiconductor device 230 via an insulating layer 217 made of an epoxy-based resin. In the first and second semiconductor devices 230 and 330 of this comparative sample, neither a cupric oxide layer nor a cuprous oxide layer was formed on either of the distributing lines 213 and 313. The rest of the arrangement is the same as the first and second samples. Therefore, the same reference numerals denote the same parts, and a detailed explanation thereof will be omitted.

Figure 33:
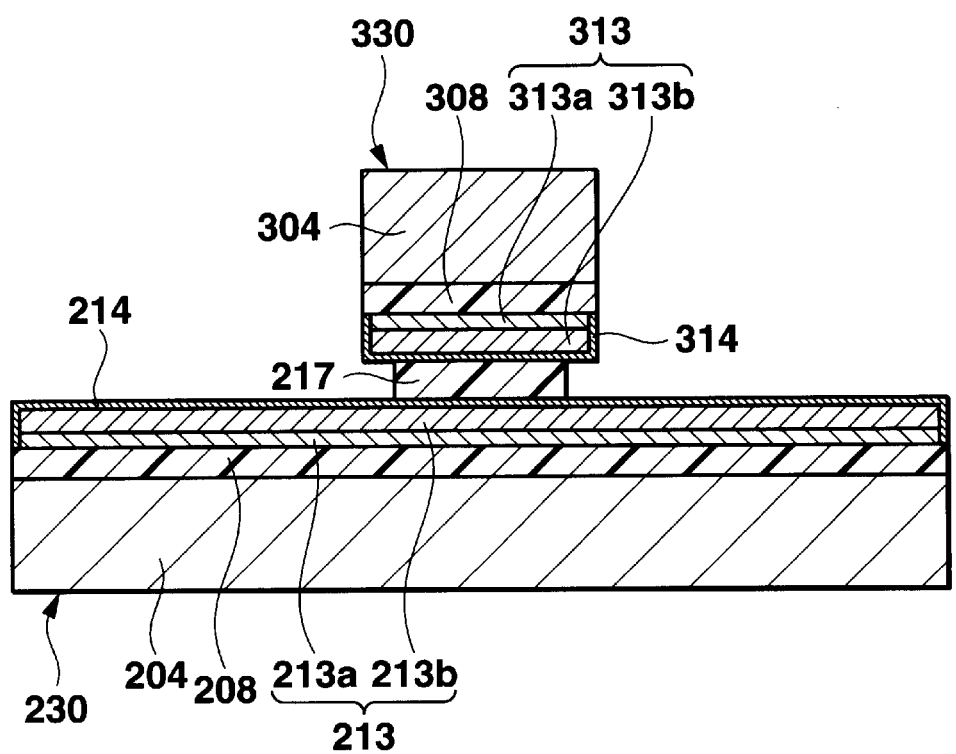
FIG. 33 is a sectional view of a first sample used in a shear strength test.
Figure 34:
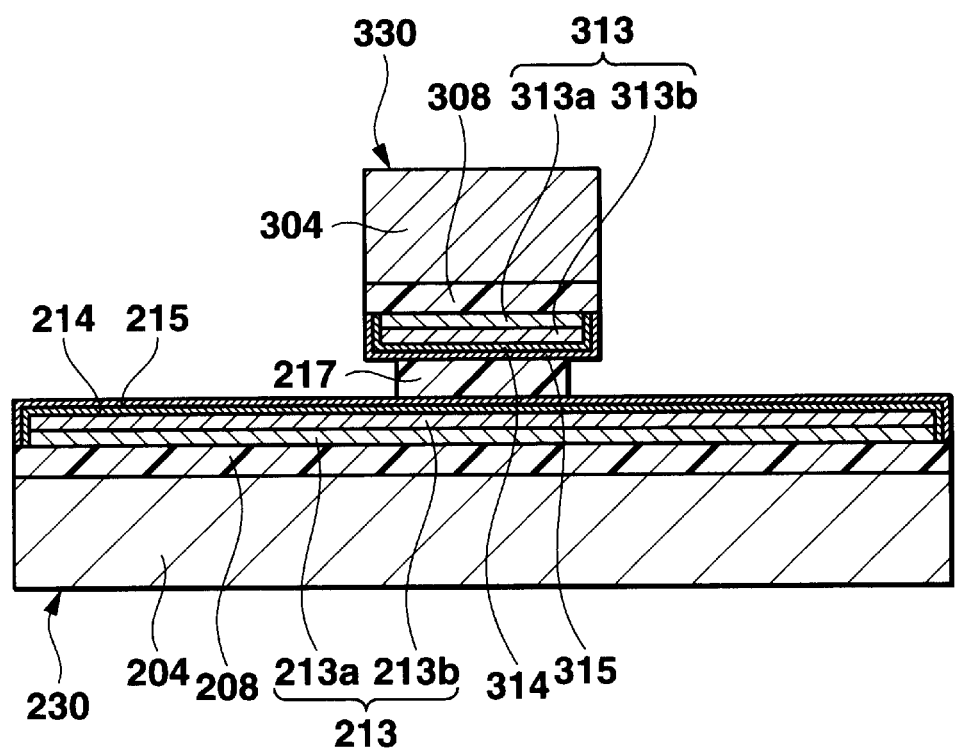
FIG. 34 is a sectional view of a second sample used in the shear strength test.

In the first sample shown in FIG. 33, the cupric oxide layer 314 of the second semiconductor device 330 was adhered to the central portion of the upper surface of the cupric oxide layer 214 of the first semiconductor device 230 via the insulating layer 217. In the second sample shown in FIG. 34, the cuprous oxide layer 315 of the second semiconductor device 330 was adhered to the central portion of the upper surface of the cuprous oxide layer 215 of the first semiconductor device 230 via the insulating layer 217. In contrast, in the comparative sample shown in FIG. 35, the distributing line 313 of the second semiconductor device 330 was directly adhered to the central portion of the upper surface of the distributing line 213 of the first semiconductor device 230 via the insulating layer 217.

The dimensions of the first, second, and comparative samples will be described below. The first semiconductor device 230 had a planar size of 8×8 mm and a total thickness of 0.75 mm. The second semiconductor device 330 had a planar size of 2×2 mm and a total thickness of 0.75 mm. The insulating layer 217 was circular and had a diameter of 1.5 mm and a thickness of 0.03 mm.

While the first semiconductor devices 230 of each of the first, second, and comparative samples were fixed, a shearing force measurement jig (not shown) was pushed against the side surface of the second semiconductor device 330, and the shear strength (N/mm$^2$) was calculated by dividing the load when the second semiconductor device 330 peeled off by the adhesion area (an area of 1.77 mm$^2$ of the insulating layer 217). More specifically, the shear strength immediately after the insulating layer 217 made of an epoxy-based resin was thermoset and the shear strength when 30 hrs had elapsed after thermosetting were calculated.

Consequently, the shear strength of the comparative sample was 31.60 N/mm$^2$ immediately after thermosetting and 11.86 N/mm after the elapse of 30 hrs. In contrast, the shear strength of the first sample was 49.15 N/mm$^2$ immediately after thermosetting, which was about 1.55 times that of the comparative sample, and was 38.41 N/mm$^2$ after the elapse of 30 hrs, which was about 3.24 times that of the comparative sample.

Also, the shear strength of the second sample was 66.10 N/mm$^2$ immediately after thermosetting, which was about 1.34 times that of the comparative sample, and was 58.76 N/mm$^2$ after the elapse of 30 hrs, which was about 1.53 times that of the comparative sample.

The above test results indicate that the adhesion of the insulating layer 217 made of an epoxy-based resin to the cupric oxide layer 214 increased compared to that when only the distributing line 213, i.e., only the copper layer was formed. Also, the adhesion when the cupric oxide layer 214 and cuprous oxide layer 215 were formed was higher than that when only the cupric oxide layer 214 was formed.

Accordingly, in the semiconductor device obtained by the method of the above embodiment, the cupric oxide layer 14 or the stacked structure of the cupric oxide layer 14 and cuprous oxide layer 15 was formed on the side surfaces of the copper layer of the second metal undercoating 13a and on the surface of the second upper metal layer 13b. This increased the adhesion between the second upper distributing line 13 and the third insulating layer 17, compared to the structure in which the second upper distributing line 13 made of copper was directly covered with the third insulating layer (encapsulating layer) 17.

More specifically, if natural copper oxide is formed on the surface of the second upper distributing line 13 made of copper while the cupric oxide layer 14 or the stacked structure of the cupric oxide layer 14 and cuprous oxide layer 15 is not formed, the adhesion of the interface between the second upper distributing line 13 and the natural copper oxide is generally weak. This causes peeling of the third insulating layer 17 made of polyimide, an epoxy-based resin or the like, formed on the surface of the second upper distributing line 13, resulting in an insufficient humidity resistance.

In contrast, when the cupric oxide layer 14 or the stacked structure of the cupric oxide layer 14 and cuprous oxide layer 15 is formed, the adhesion of the interface between the second upper distributing line 13 and the cupric oxide layer 14 is strong. In addition, since the surface of the cuprous oxide layer 15 becomes to have needle crystals, the anchor effect increases the adhesion of the interface between the cuprous copper layer 15 and the third insulating layer 17. As a consequence, the third insulating layer 17 does not easily peel off any longer, so the humidity resistance can be increased.

In the above fabrication method, the first metal undercoating 10a and first upper metal layer 10b to be connected to the connecting pad 5 of the semiconductor structure 3 are formed by sputtering and electroplating, the columnar electrode 11 to be connected to the connecting pad portion of the first upper distributing line 10 is formed by electroplating, and the second metal undercoating 13a and second upper metal layer 13b to be connected to the upper surface of the columnar electrode 11 are formed by sputtering and electroplating. This improves the reliability of the conductive connection between the connecting pad 5 and the first upper distributing line 10 of the semiconductor structure 3, the conductive connection between the first upper distributing line 10 and the columnar electrode 11, and the conductive connection between the columnar electrode 11 and the second upper distributing line 13.

Also, the columnar electrode 11 of about 100 to 150 $\mu$m high is formed between the first and second upper distributing lines 10 and 13. Therefore, when the semiconductor device is bonded to a circuit board (not shown), concentrated stress produced by the difference between the linear expansion coefficients of the semiconductor structure 3 and circuit board can be absorbed by shaking of the columnar electrode 11.

The semiconductor structures 3 are adhered to a plurality of predetermined portions on the adhesive layer 2 on the base plate 1, and the first to third insulating layers 8, 12, and 17, the first and second distributing lines 10 and 13, the columnar electrodes 11, and the solder balls 19 are formed for the semiconductor structures 3 at once. After that, the resultant structure is cut into a plurality of semiconductor devices. This simplifies the fabrication process.

In addition, a plurality of semiconductor structures 3 can be transferred together with the base plate 1, and this also simplifies the fabrication process. Furthermore, when the base plate 1 is given predetermined outer dimensions, a common transfer system can be used regardless of the outer dimensions of semiconductor devices to be fabricated.

Note that an aqueous solution of sodium chlorite in the second processing solution is an oxidizing alkali solution which is strong alkali having a pH of 12 or more. Therefore, if the processing temperature is about 55° C., this solution dissolves the silicon substrate 4, so the processing time is as short as possible. In the above embodiment, the processing time is about 1 min.

Figure 14:
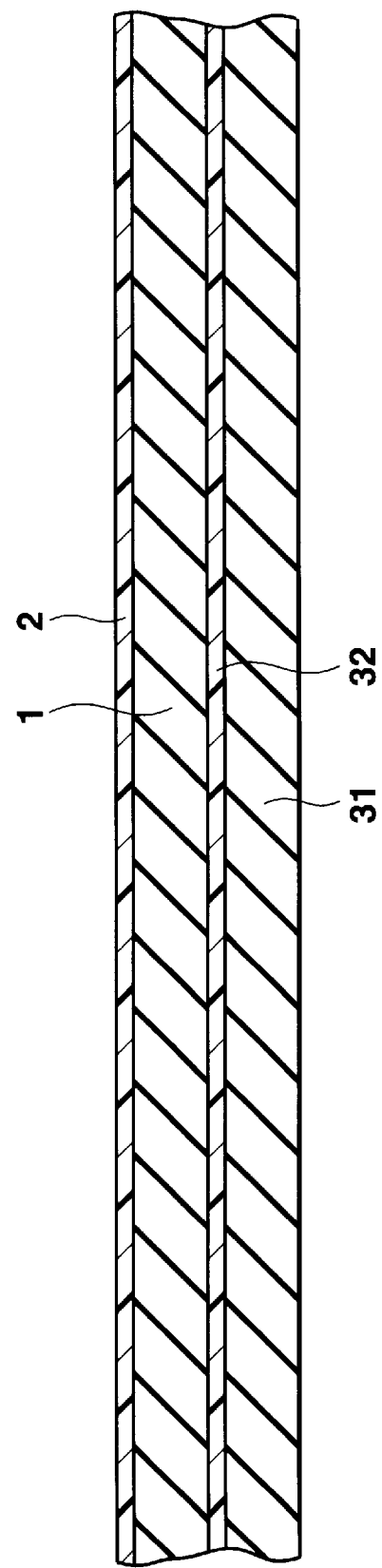
FIG. 14 is an enlarged sectional view of an initially prepared base member, for explaining a modification of the fabrication method of the semiconductor device shown in FIG. 1.

A modification of the fabrication method of the semiconductor device shown in FIG. 1 will be described below. First, as shown in FIG. 14, an adhesive layer 32 made of an ultraviolet-curing self-adhesive sheet or the like is adhered to the entire upper surface of a lower base plate 31 such as an ultraviolet-transmitting transparent resin plate or glass plate, and a base plate 1 and adhesive layer 2 described above are adhered to the upper surface of the adhesive layer 32.

Figure 15:
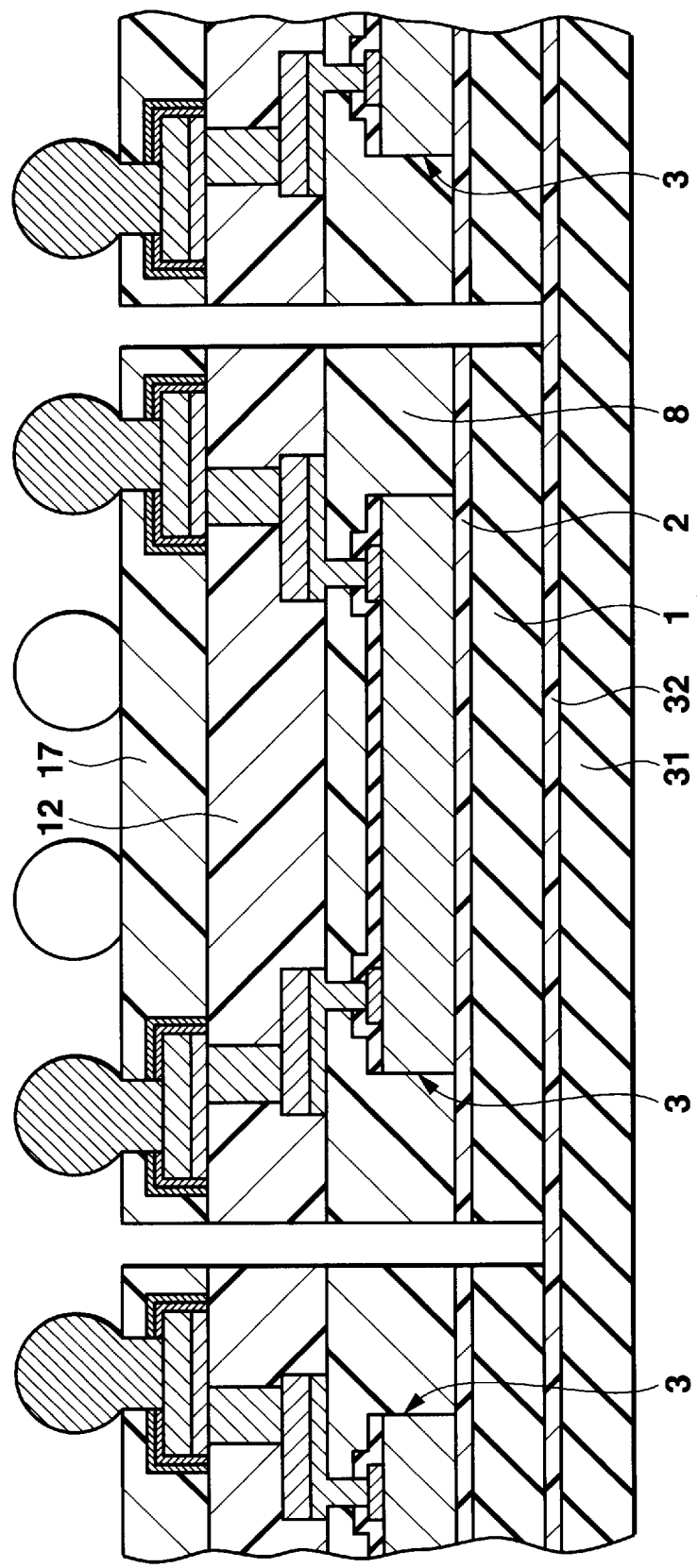
FIG. 15 is an enlarged sectional view of the state in which the semiconductor device is separated into individual semiconductor devices, for explaining a modification of the fabrication method of the semiconductor device shown in FIG. 4.

After the fabrication steps shown in FIGS. 2 to 12 are performed, as shown in FIG. 15, three insulating layers 17, 12, and 8, the adhesive layer 2, the base plate 1, and the adhesive layer 32 are cut between adjacent semiconductor structures 3, and the adhesive layer 32 and the lower base plate 31 is left uncut. Ultraviolet radiation is emitted from the lower surface of the lower base plate 31, thereby curing the adhesive layer 32. This lowers the adhesion of the adhesive layer 32 to the lower surfaces of the divided base plates 1. Accordingly, the divided semiconductor devices on the adhesive layer 32 are peeled and picked up one by one to obtain a plurality of semiconductor devices shown in FIG. 1.

In the state shown in FIG. 15 of this fabrication method, the divided semiconductor devices on the adhesive layer 32 are not yet separated. Therefore, these semiconductor devices can be peeled and picked up one by one when they are mounted on a circuit board (not shown), without using any dedicated semiconductor device tray. Also, when the adhesive layer 32 remaining on the upper surface of the lower base plate 31 and having low adhesion is peeled, the lower base plate 31 can be reused. Furthermore, when base plates 1 are given predetermined outer dimensions, a common transfer system can be used regardless of the outer dimensions of semiconductor devices to be fabricated. Note that a thermosetting self-adhesive sheet or the like may also be used as the adhesive layer 32 in some cases.

As the lower base plate 31, it is also possible to use a common dicing tape from which semiconductor devices are removed by expansion. In this case, the adhesive layer need not be ultraviolet-curing. The lower base plate 31 may also be removed by polishing or etching.

Figure 16:
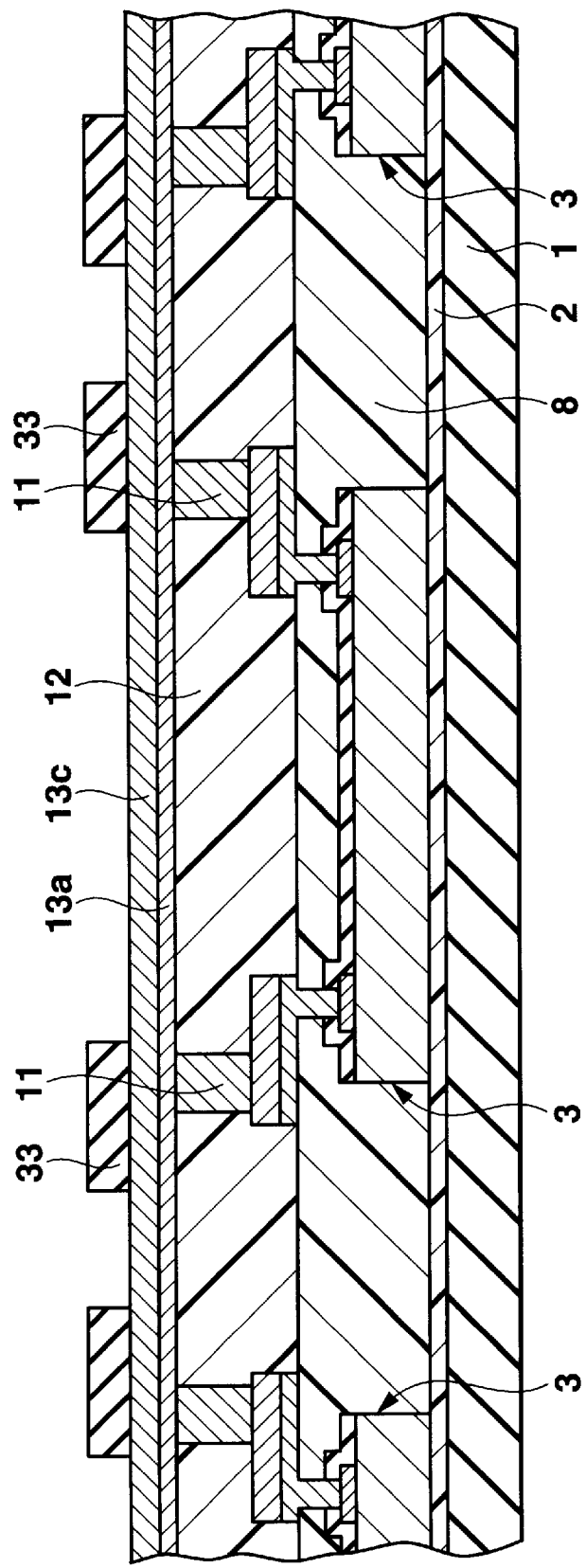
FIG. 16 is an enlarged sectional view of a main part fabrication step, for explaining the second modification of the fabrication method of the semiconductor device shown in FIG. 1.

A second modification of the fabrication method of the semiconductor device shown in FIG. 1 will be described below. In this fabrication method, as shown in FIG. 16, after the fabrication step shown in FIG. 8 a layer forming second metal undercoatings 13a is formed by electroless plating of copper on the entire upper surface of a second insulating layer 12 including the upper surfaces of columnar electrodes 11. Subsequently, the layer for the second metal undercoatings 13a is used as a plating current path to perform electroplating of copper, thereby forming a second upper metal layer formation layer 13c on the entire upper surface of the layer for second metal undercoatings 13a.

Figure 17:
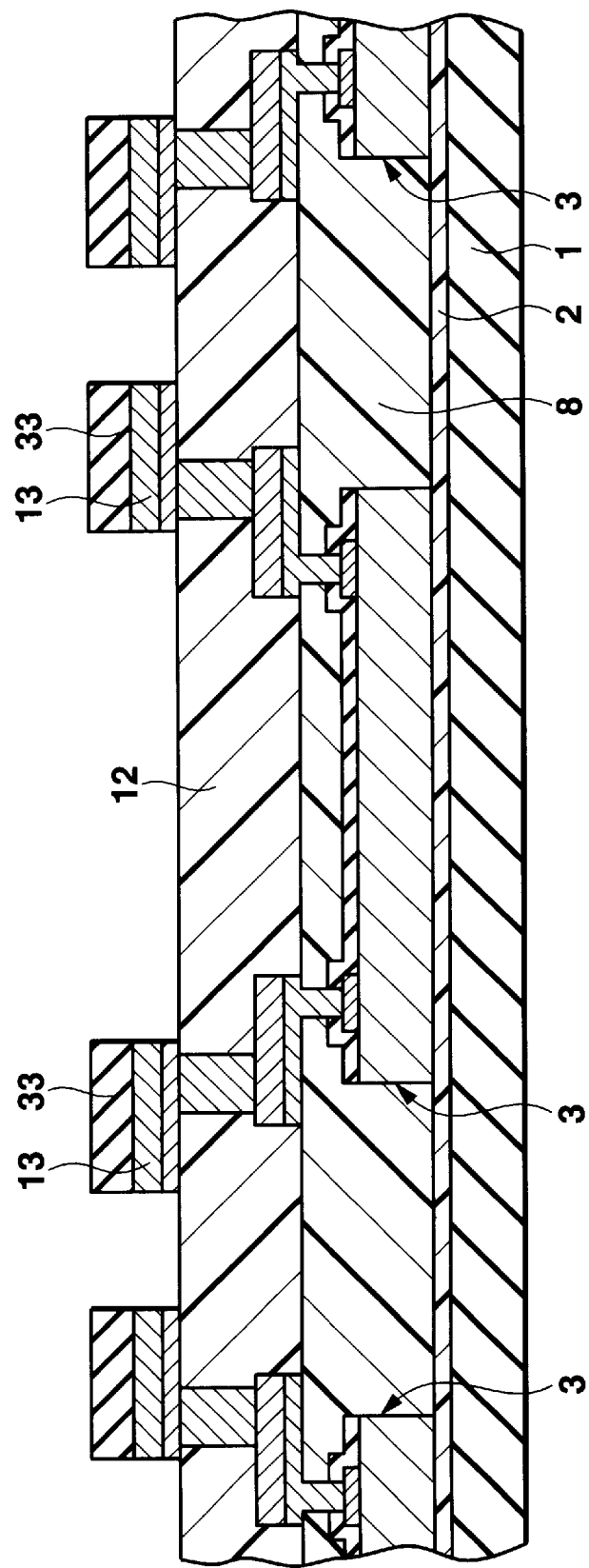
FIG. 17 is a sectional view of a fabrication step following FIG. 16.

A resist layer 33 is then formed by patterning on those portions of the upper surface of the second upper metal layer formation layer 13c, which correspond to prospective second distributing line regions. The resist layer 33 is used as a mask to etch away unnecessary portions of the second upper metal layer formation layer 13c and the layer for second metal undercoatings 13a. Consequently, as shown in FIG. 17, second upper distributing lines 13 are left behind only below the resist layer 33. After that, the resist layer 33 is removed.

Note that the base plate 1 shown in FIG. 2 or the lower base plate 31 shown in FIG. 14 can also be a tray. That is, the base plate is formed into a shape like a saucer in which an array region of semiconductor structures 3 is depressed from the surrounding. A plating current path metal layer is formed on the upper surface surrounding the array region of semiconductor structures 3 of this tray-like base plate and connected to plating current path metal undercoatings (10a and 13a) by a conductive member, thereby performing electroplating. When trays are given predetermined outer dimensions, the same fabrication apparatus can be used even when the sizes of semiconductor devices to be fabricated are different. This increases the fabrication efficiency.

(Second Embodiment)

Figure 18:
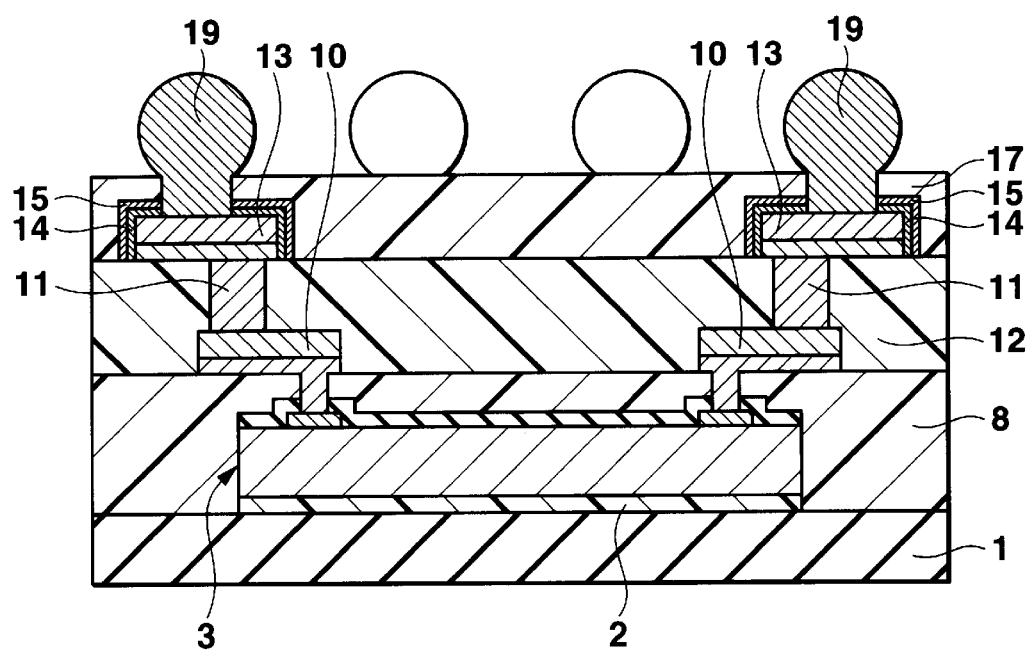
FIG. 18 is an enlarged sectional view of a semiconductor device according to the second embodiment of the present invention.

In the fabrication step shown in FIG. 2, if an adhesive layer 2 is formed on the lower surface of a silicon substrate 4 of a semiconductor structure 3, and adhered to a predetermined portion of the upper surface of a base plate 1, a semiconductor device according to the second embodiment of the present invention shown in FIG. 18 is obtained.

In this semiconductor device, the lower surface of the silicon substrate 4 is adhered to the upper surface of the base plate 1 via the adhesive layer 2, and the side surfaces and the like of the silicon substrate 4 are bonded to the upper surface of the base plate 1 via a first insulating layer 8. Therefore, the bonding strength of the semiconductor structure 3 to the base plate 1 can be increased to a certain extent.

(Third Embodiment)

Figure 19:
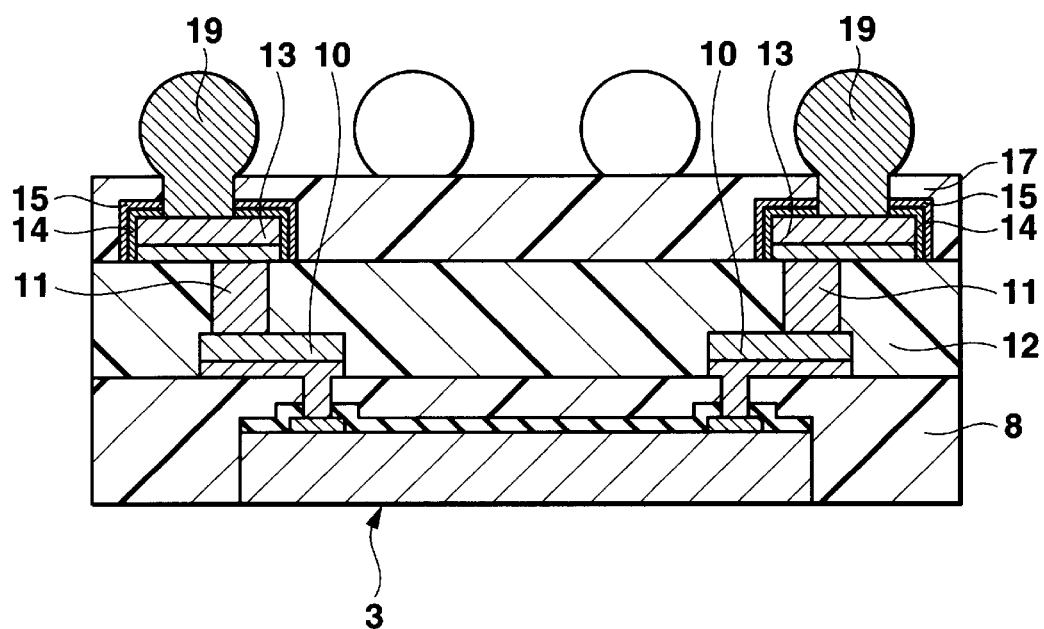
FIG. 19 is an enlarged sectional view of a semiconductor device according to the third embodiment of the present invention.

FIG. 19 is a sectional view of a semiconductor device according to the third embodiment of the present invention. This semiconductor device differs from the semiconductor device shown in FIG. 1 in that the device has neither a base plate 1 nor an adhesive layer 2.

To fabricate this semiconductor device of the third embodiment, after solder balls 19 are formed as shown in FIG. 12, a base plate 1 and adhesive layer 2 are removed by polishing or etching. After that, three insulating layers 17, 12, and 8 are cut between adjacent semiconductor structures 3 to obtain a plurality of semiconductor devices shown in FIG. 19. The semiconductor device thus obtained can be made thin because it has neither a base plate 1 nor an adhesive layer 2.

(Fourth Embodiment)

Figure 20:
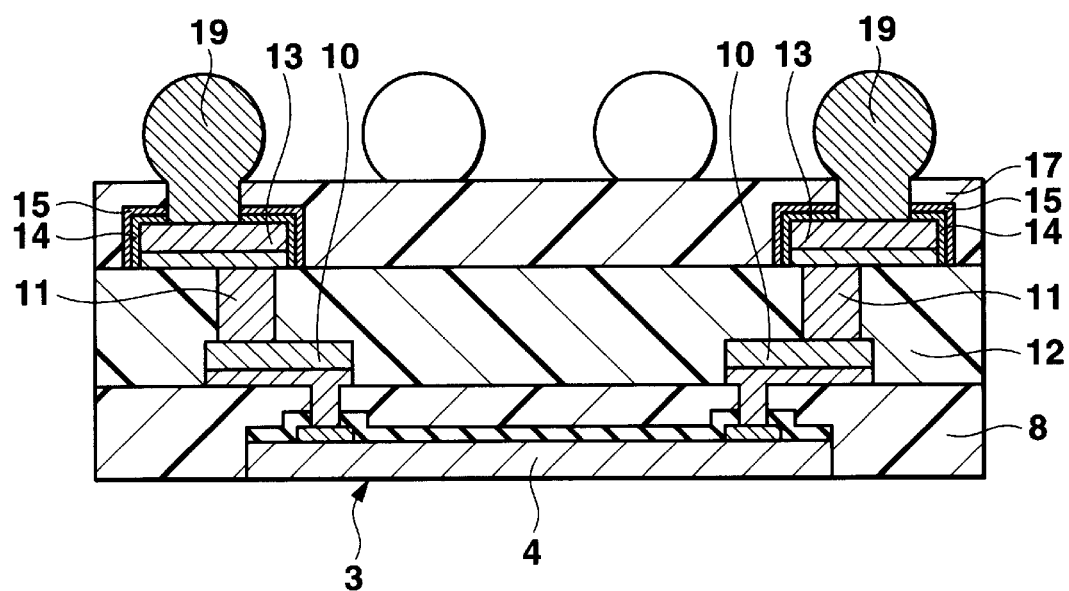
FIG. 20 is an enlarged sectional view of a semiconductor device according to the fourth embodiment of the present invention.

By the method described in the third embodiment, a base plate 1 and adhesive layer 2 are removed by polishing or etching to form a semiconductor device shown in FIG. 19. Subsequently, the lower surfaces of a silicon substrate 4 and first insulating layer 8 are appropriately polished. Then, three insulating layers 17, 12 and 8 are cut between adjacent semiconductor structures 3 to obtain a plurality of semiconductor devices according to the fourth embodiment of the present invention shown in FIG. 20. This semiconductor device can be made thinner.

It is also possible to remove the base plate 1 and adhesive layer 2 by polishing or etching (and, if necessary, appropriately polish the lower surfaces of the silicon substrate 4 and first insulating layer 8) before solder balls 19 are formed, form solder balls 19 after that, and then cut the three insulating layers 17, 12 and 8 between the adjacent semiconductor devices 3.

(Fifth Embodiment)

Figure 21:
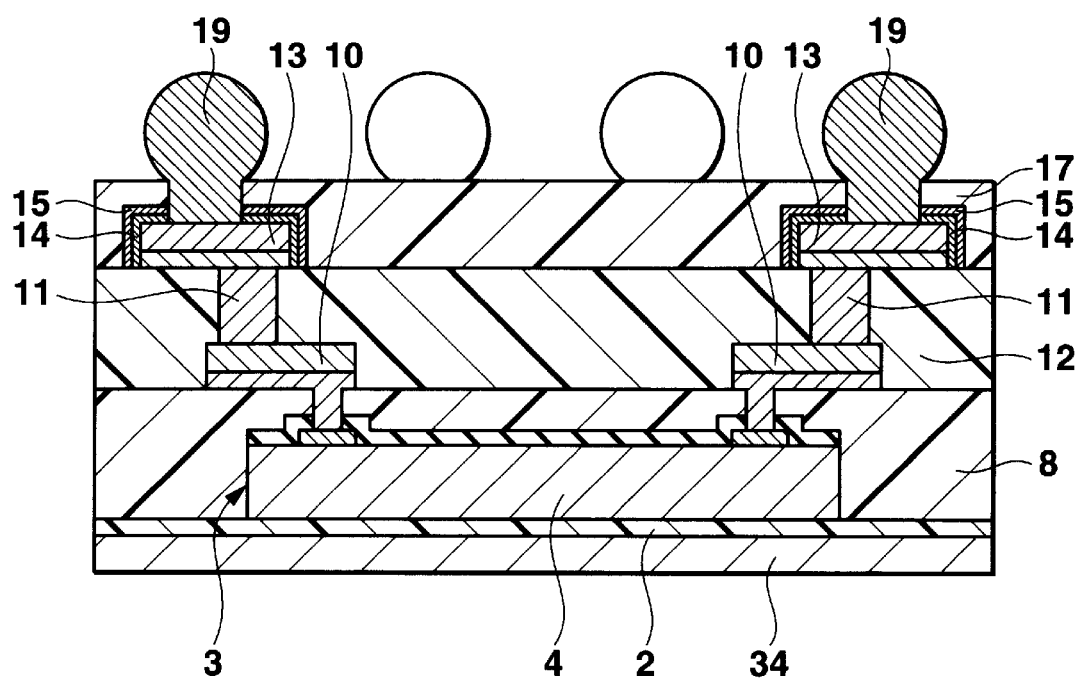
FIG. 21 is an enlarged sectional view of a semiconductor device according to the fifth embodiment of the present invention.

FIG. 21 is a sectional view of a semiconductor device according to the fifth embodiment of the present invention. This semiconductor device differs from the semiconductor device shown in FIG. 1 in that a heat-radiating metal layer 34 is adhered to the lower surface of an adhesive layer 2. The metal layer 34 is made of, e.g., a copper foil having a thickness of several tens $\mu$m.

To fabricate this semiconductor device of the fifth embodiment, after solder balls 19 are formed as shown in, e.g., FIG. 12, a base plate 1 is removed by polishing or etching, and a metal layer 34 is adhered to the entire lower surface of an adhesive layer 2. After that, three insulating layers 17, 12 and 8, the adhesive layer 2, and the metal layer 34 are cut between adjacent semiconductor structures 3 to obtain a plurality of semiconductor devices shown in FIG. 21.

It is also possible to remove an adhesive layer 2 by polishing or etching (and, if necessary, appropriately polish the lower surfaces of a silicon substrate 4 and first insulating layer 8), and adhere a metal layer 34 to the lower surfaces of the silicon substrate 4 and first insulating layer 8 via a new adhesive layer.

(Sixth Embodiment)

Figure 22:
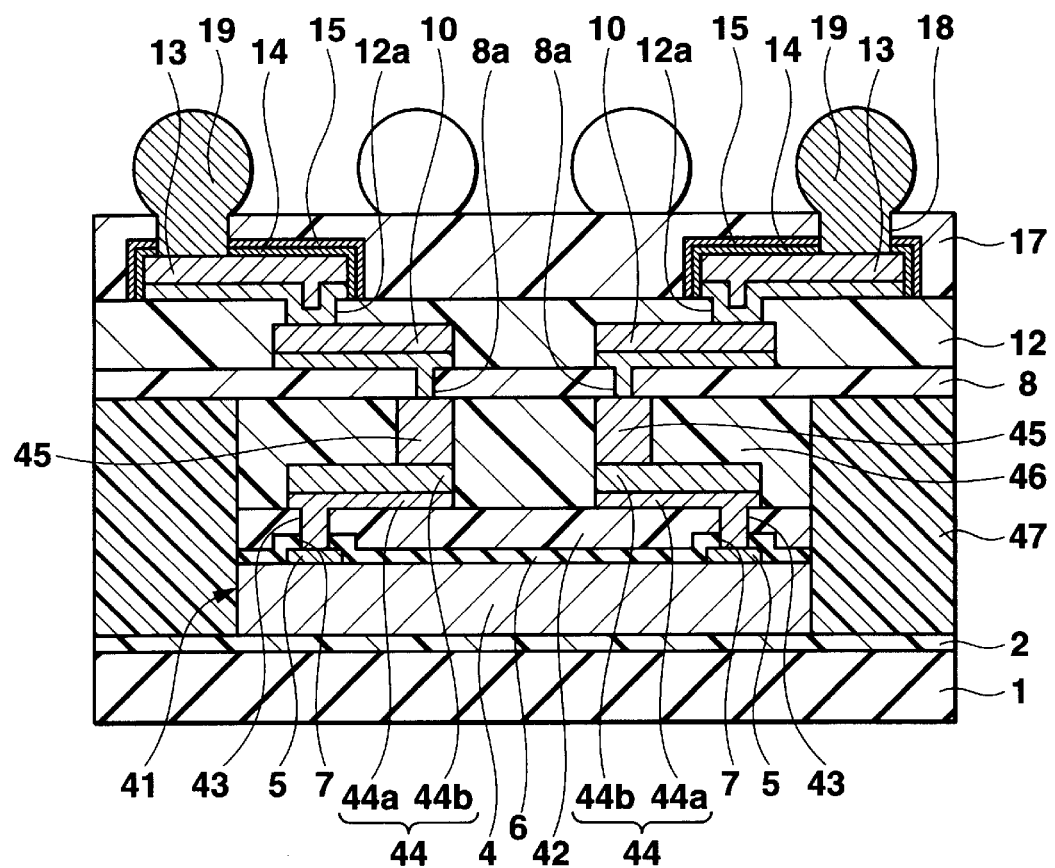
FIG. 22 is an enlarged sectional view of a semiconductor device according to the sixth embodiment of the present invention.

FIG. 22 is a sectional view of a semiconductor device according to the sixth embodiment of the present invention. Large differences of this semiconductor device from the semiconductor device shown in FIG. 1 are that a package generally called a wafer level (WL) CSP is used as a semiconductor structure 41 on a base plate 1, the columnar electrode 11 shown in FIG. 1 is not formed on the WLCSP, and a second upper distributing line 13 is connected to a connecting pad portion of a first upper distributing line 10 through a hole 12a formed in a second insulating layer 12.

The semiconductor structure 41 is called a WLCSP, and includes a silicon substrate 4 adhered to a central portion of the upper surface of an adhesive layer 2 formed on the base plate 1. An integrated circuit portion (not shown) is formed in a central portion of the upper surface of the silicon substrate 4. In a peripheral portion of the upper surface of the silicon substrate 4, a plurality of connecting pads 5 made of an aluminum-based metal or the like are formed and electrically connected to the integrated circuit portion. An insulating layer 6 made of silicon oxide or the like is formed on the upper surface of the silicon substrate 4 except for central portions of the connecting pads 5. These central portions of the connecting pads 5 are exposed through holes 7 formed in the insulating layer 6. The structure up to this point is the same as the semiconductor structure 3 shown in FIG. 1.

In the semiconductor structure 41 of this embodiment, a protective layer 42 made of, e.g., polyimide or an epoxy-based resin is additionally formed on the upper surface of the insulating layer 6. Holes 43 are formed in those portions of the protective layer 42, which correspond to holes 7 in the insulating layer 6. Distributing lines (lower distributing lines) 44 are formed from the upper surfaces of the connecting pads 5 exposed through the holes 7 and 43 to predetermined portions of the upper surface of the protective layer 42. Each distributing line 44 is made up of a metal undercoating 44a made of copper or the like and an upper metal layer 44b formed on the metal undercoating 44a and made of copper.

Columnar electrodes 45 made of copper are formed on the upper surfaces of connecting pad portions of the distributing lines 44. A lower encapsulating layer 46 made of, e.g., polyimide or an epoxy-based resin is formed on the upper surface of the protective layer 42 including the distributing lines 44 such that the upper surface of the lower encapsulating layer 46 is leveled with the upper surfaces of the columnar electrodes 45. As described above, the semiconductor structure 41 of this embodiment includes the silicon substrate 4, connecting pads 5, and insulating layer 6, and further includes the protective layer 42, distributing lines 44, columnar electrodes 45, and lower encapsulating layer 46.

On the upper surface of the adhesive layer 2 around the semiconductor structure 41, a side insulating layer 47 made of, e.g., polyimide or an epoxy-based resin is formed such that the upper surface of the side insulating layer 47 is leveled with the upper surface of the lower encapsulating layer 46. A first insulating layer 8 made of, e.g., polyimide or an epoxy-based resin is formed on the upper surfaces of the side insulating layer 47 and columnar electrodes 45. Holes 8a are formed in those portions of the first insulating layer 8, which correspond to central portions of the upper surfaces of the columnar electrodes 45.

First distributing lines 10 are formed from the upper surfaces of the columnar electrodes 45 exposed through the holes 8a to predetermined portions of the upper surface of the first insulating layer 8. The arrangement of a portion above the first insulting layer 8 including the first upper distributing lines 10 is substantially the same as shown in FIG. 1, so a detailed explanation thereof will be omitted. As described above, however, this embodiment does not include the columnar electrodes 11 shown in FIG. 1. Instead, second upper distributing lines 13 are connected to the connecting pad portions of the first upper distributing lines 10 through the holes 12a formed in the second insulating layer 12.

An example of a method of fabricating the semiconductor structure 41 will be briefly described below. First, a wafer-like semiconductor substrate (a silicon substrate 4 before being cut) on which connecting pads 5, an insulating layer 6, and a protective layer 42 are formed is prepared. Next, a layer forming lower metal layers 44a is formed by electroless plating or sputtering on the entire upper surface of the protective layer 42 including the upper surfaces of the connecting pads 5 exposed in holes 7 and 43.

Subsequently, upper metal layers 44b are formed by electroplating on predetermined portions of the upper surface of the layer of the metal undercoatings 44a. Columnar electrodes 45 are formed by electroplating on the upper surfaces of connecting pad portions of the upper metal layers 44b. The columnar electrodes 45 and upper metal layers 44b are used as masks to etch away unnecessary portions of the layer for the metal undercoatings 44a so that the metal undercoatings 44a remain only below the upper metal layers 44b, thereby forming distributing lines 44 made up of the remaining metal undercoatings 44a and the upper metal layers 44b formed on the entire upper surfaces of the metal undercoatings 44a.

On the upper surfaces of the protective layer 42 including the columnar electrodes 45 and distributing lines 44, a lower encapsulating layer 46 is so formed as to have a thickness larger than the height of the columnar electrodes 45. In this state, the upper surfaces of the columnar electrodes 45 are covered with the lower encapsulating layer 46. The upper surfaces of the lower encapsulating layer 46 and columnar electrodes 45 are appropriately polished to expose the upper surfaces of the columnar electrodes 45. After a dicing step is performed, a plurality of semiconductor structures 41 shown in FIG. 22 are obtained. The columnar electrodes 45 have a height of about 100 to 150 μm.

Figure 23:
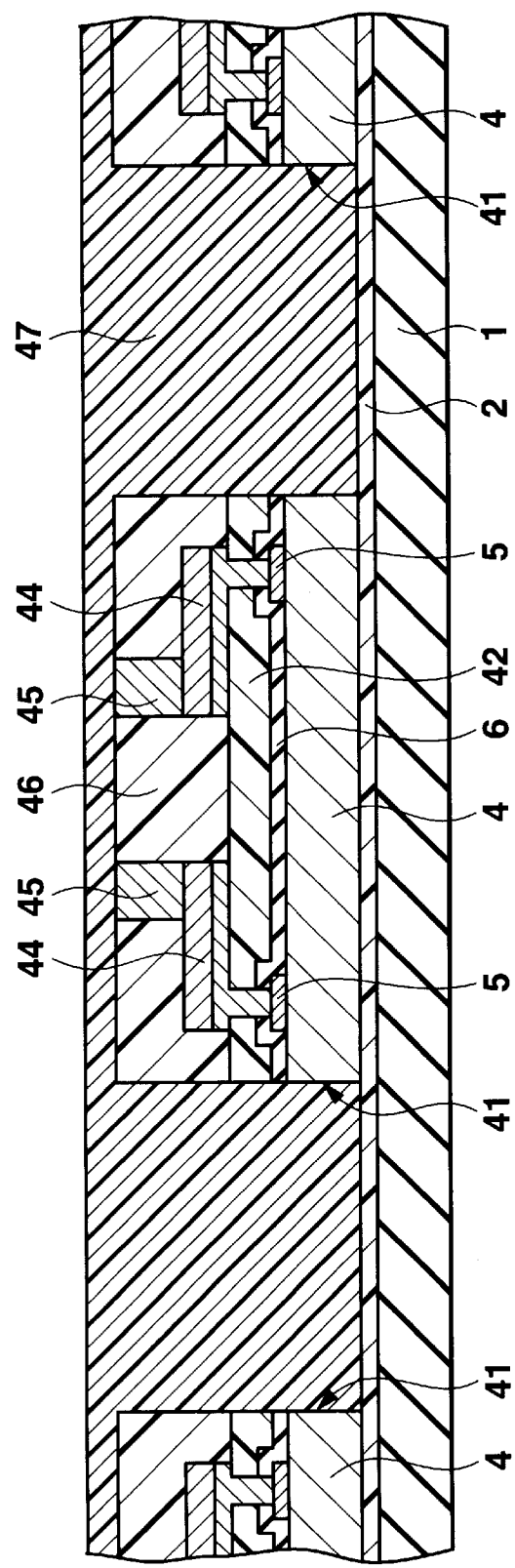
FIG. 23 is an enlarged sectional view of an initial fabrication step in the fabrication of the semiconductor device shown in FIG. 22.

An example of a method of fabricating the semiconductor device shown in FIG. 22 by using the semiconductor structure 41 thus obtained will be explained below. First, as shown in FIG. 23, an adhesive layer 2 is formed on the entire upper surface of a large base plate from which a plurality of small base plates 1 shown in FIG. 22 can be obtained. The lower surfaces of silicon substrates 4 of semiconductor structures 41 are adhered to a plurality of predetermined portions of the upper surface of the adhesive layer 2.

Figure 24:
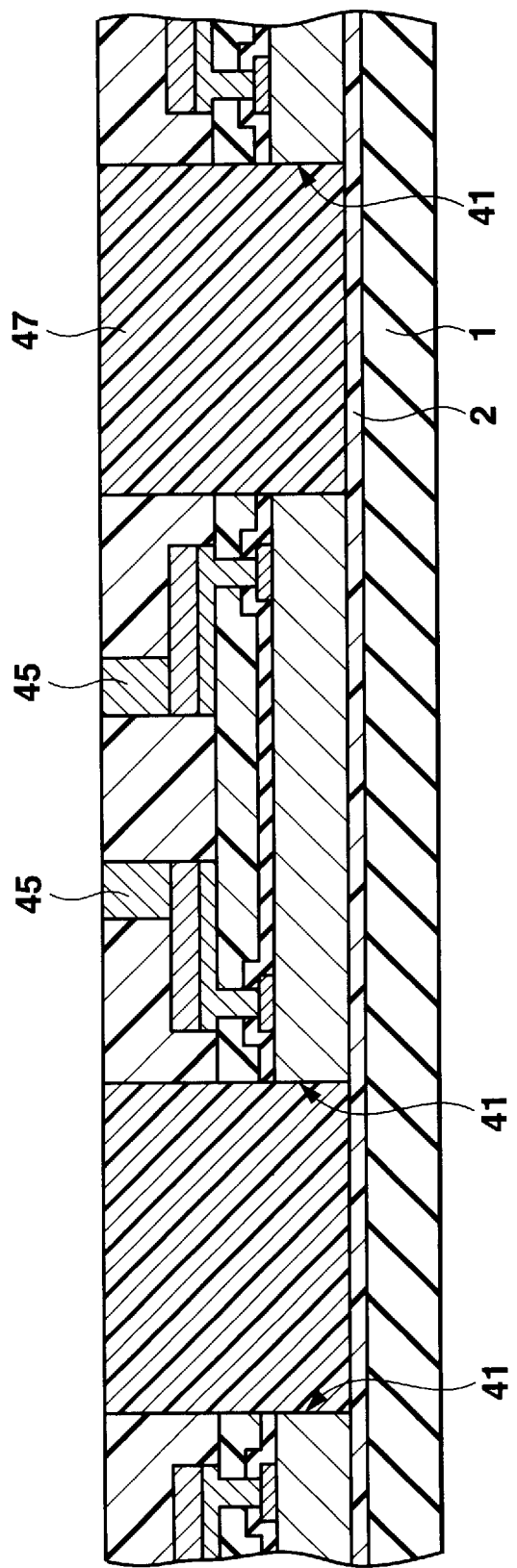
FIG. 24 is a sectional view of a fabrication step following FIG. 23.

Next, a side insulating layer 47 made of, e.g., polyimide or an epoxy-based resin is formed on the upper surface of the adhesive layer 2 including the semiconductor structures 41 such that the thickness of the side insulating layer 47 is slightly larger than the height of the semiconductor structures 41. In this state, the upper surfaces of the semiconductor structures 41 are covered with the side insulating layer 47. Subsequently, as shown in FIG. 24, the upper surfaces of the side insulating layer 47 and columnar electrodes 45 are appropriately polished to expose the upper surfaces of columnar electrodes 45 of the semiconductor structures 41.

As described above, to fabricate the semiconductor structure 41 shown in FIG. 22, a lower encapsulating layer 46 is formed on the upper surface of a protective layer 42 including the columnar electrodes 45 and distributing lines 44 such that the thickness of the lower encapsulating layer 46 is slightly larger than the height of the columnar electrodes 45. The upper surfaces of the lower encapsulating layer 46 and columnar electrodes 45 are appropriately polished so that the upper surfaces of the columnar electrodes 45 are leveled with the upper surface of the encapsulating layer 46. Accordingly, two polishing steps are performed.

A method by which only one polishing step need be performed will be described below. A semiconductor structure 41 having no lower encapsulating layer 46 in the state shown in FIG. 23 is prepared. That is, after a protective layer 42, distributing lines 44, and columnar electrodes 45 are formed on a wafer-like semiconductor substrate on which connecting pads 5 and an insulating layer 6 are formed, the semiconductor substrate is diced without forming a lower encapsulating layer 46.

In the fabrication step shown in FIG. 23, a lower encapsulating layer 46 and side insulating layer 47 are simultaneously formed by the same encapsulating material in prospective regions of these layers, and the upper surfaces of the columnar electrodes 45 are polished together with the lower encapsulating layer 46 and side insulating layer 47 (there is no boundary between these layers because they are integrated). That is, the encapsulating layer formation step is performed only once, so the polishing step need only be performed once.

When the polishing step is performed only once, the heights of the columnar electrodes 45 of the semiconductor structure 41 in the state shown in FIG. 23 vary because the columnar electrodes 45 are formed by electroplating. When the polishing step is performed twice, the semiconductor structure 41 in the state shown in FIG. 23 has a uniform height. That is, the height of the semiconductor structure 41 in the state shown in FIG. 23 can be made uniform beforehand.

Figure 25:
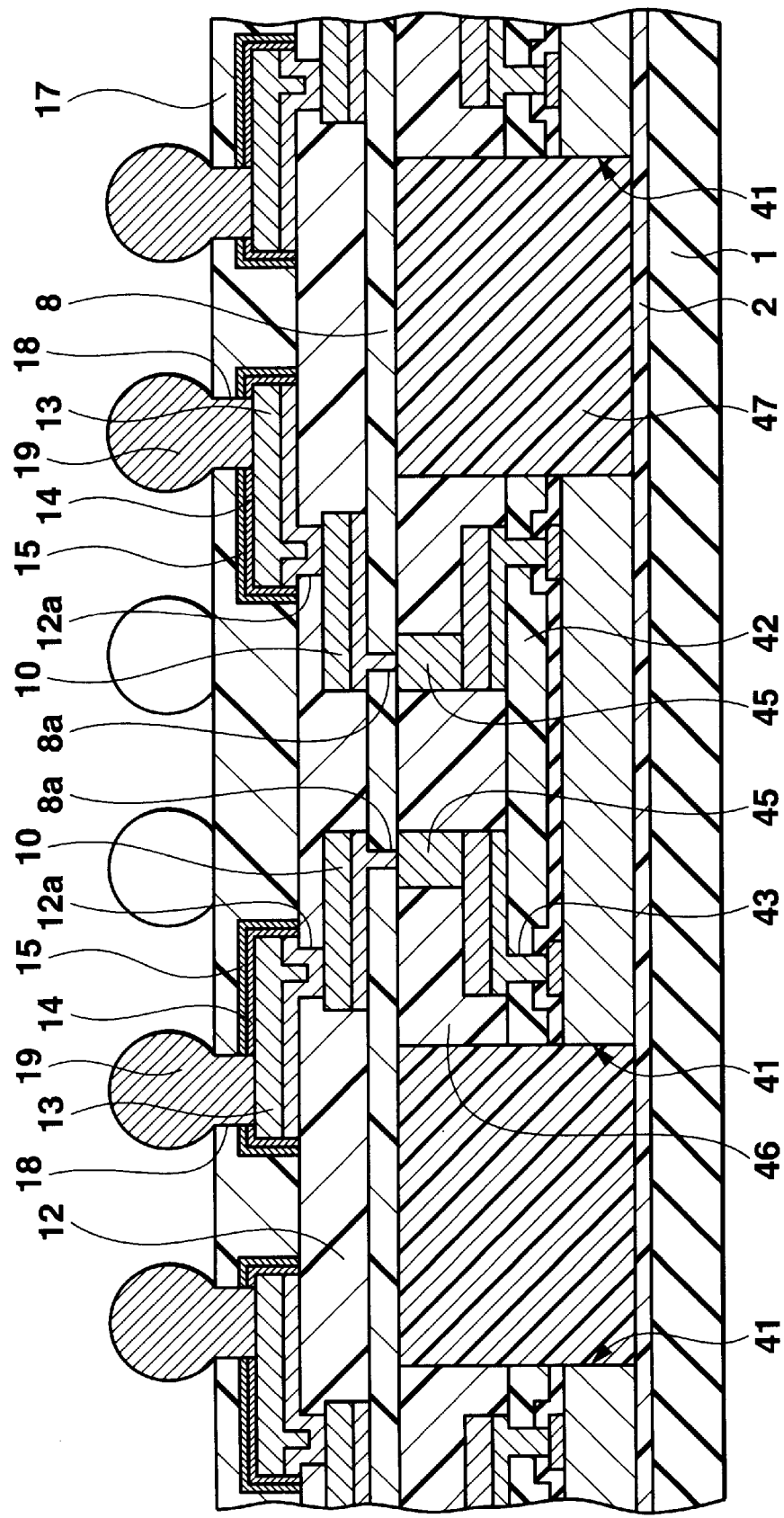
FIG. 25 is a sectional view of a fabrication step following FIG. 24.

After the polishing step shown in FIG. 24 is complete, as shown in FIG. 25, a first insulating layer 8 made of, e.g., polyimide or an epoxy-based resin is formed on the upper surfaces of the lower encapsulating layer 46, side insulating layer 47, and columnar electrodes 45 on the same level. In this state, holes 8a are formed in those portions of the first insulating layer 8, which correspond to central portions of the upper surfaces of the columnar electrodes 45.

As will be readily understood from the fabrication method according to the first embodiment described earlier, first upper distributing lines 10 are formed by plating on predetermined portions of the upper surface of the first insulating layer 8 and on the upper surfaces of the columnar electrodes 45 exposed through the holes 8a, and a second insulating layer 12 having holes 12a is formed. Second upper distributing lines 13 are formed on predetermined portions of the upper surface of the second insulating layer 12 and on the upper surfaces of connecting pad portions of the first upper distributing lines 10 exposed through the holes 12a. Cupric oxide layers 14 and cuprous oxide layers 15 are formed in this order on the surfaces of the second upper distributing lines 13 except for their connecting pad portions. A third insulating layer 17 having holes 18 is formed, and solder balls 19 are formed. Then, the three insulating layers 17, 12 and 8, side insulating layer 47, adhesive layer 2, and base plate 1 are cut between adjacent semiconductor structures 41 to obtain a plurality of semiconductor devices shown in FIG. 22.

In this structure, the first upper distributing lines 10 are directly bonded onto the columnar electrodes 45 by plating. Therefore, the hole 8a in the first insulating layer 8 is sufficiently strong if the hole 8a is a square or circular hole having an area of at least 10 μm×10 μm. An aligner of this type has an alignment accuracy of several tens μm, and the diameter of a circular columnar electrode is usually about 100 to 150 μm (the pitch is usually twice this value). Compared to a bonding method, connecting the columnar electrodes and distributing lines by plating can be applied even when the size and interval of the columnar electrodes are very small, and the process is also efficient.

In this fabrication method as described above, the width or diameter of the hole 8a formed in the first insulating layer 8 to connect the first upper distributing line 10 to the columnar electrode 45 can be ½ or less the width or diameter of the columnar electrode 45. Since this decreases the size and interval of the columnar electrodes 45 of the semiconductor structure 41, a semiconductor device having upper distributing lines such as the first upper distributing lines 10 can be further downsized.

(Seventh Embodiment)

Figure 26:
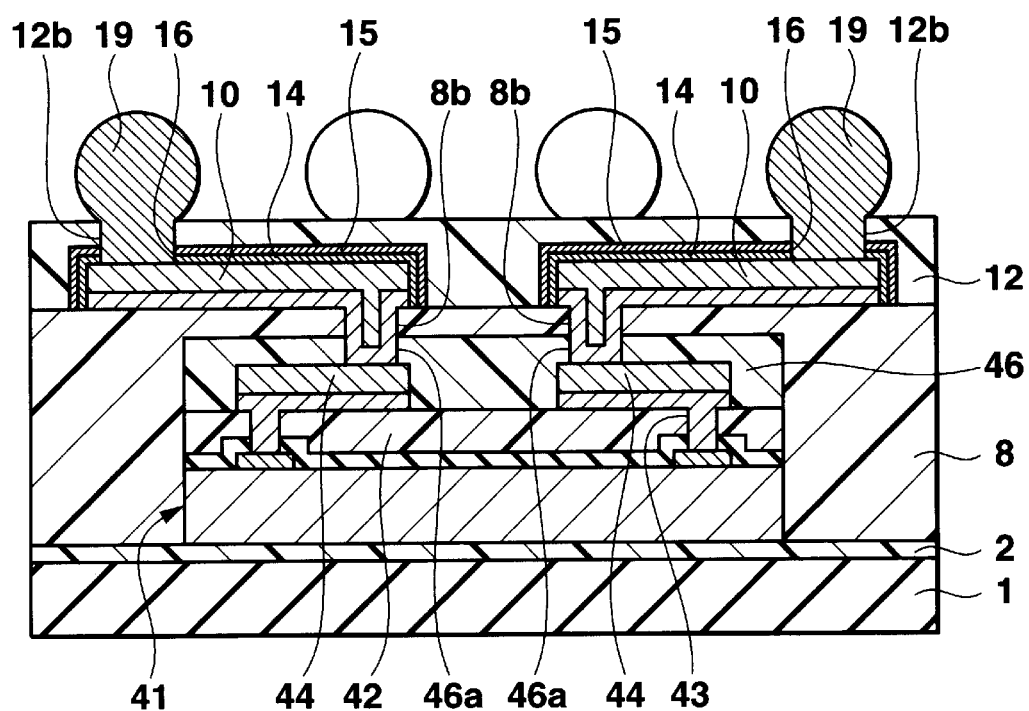
FIG. 26 is a sectional view of a semiconductor device according to the seventh embodiment of the present invention.

FIG. 26 is a sectional view of a semiconductor device according to the seventh embodiment of the present invention. Compared to the semiconductor structure 41 shown in FIG. 22, a semiconductor structure 41 of this semiconductor device has no columnar electrodes 45, and holes 46a are formed in those portions of a lower encapsulating layer 46, which correspond to connecting pad portions of distributing lines 44.

Differences of this semiconductor device from the semiconductor device shown in FIG. 1 are as follows. That is, first upper distributing lines 10 are connected to the connecting pad portions of the distributing lines 44 through holes 8b in a first insulating layer 8 and the holes 46a in the lower encapsulating layer 46. Cupric oxide layers 14 and cuprous oxide layers 15 are formed in this order on the surfaces of the first upper distributing lines 10 except for their connecting pad portions. Solder balls 19 are formed in holes 12b in a second insulating layer 12 which is formed on the copper oxide layers 14 and 15, and in holes 16 in the copper oxide layers 14 and 15, so as to be connected to the connecting pad portions of the first upper distributing lines 10.

As is apparent from the arrangement of the semiconductor device of this embodiment, the semiconductor structure 41 need not have any columnar electrodes, i.e., need only have the distributing lines 44. In addition, the upper distributing line may also be one layer, i.e., the first upper distributing line 10 (in this case, the second insulating layer 12 is an overcoat layer). Although not shown, three or more upper distributing line layers may also be formed. A method of forming three upper distributing line layers will be briefly described below. A third insulating layer (denoted by reference numeral 17 in FIG. 1) is formed on a second insulating layer 12, and third upper distributing lines are formed on the third insulating layer 12. Cupric oxide and cuprous oxide layers are formed on the surfaces of the third upper distributing lines except for their connecting pads. A fourth insulating layer is formed as an overcoat layer on the cupric oxide and cuprous oxide layers.

(Eighth Embodiment)

Figure 27:
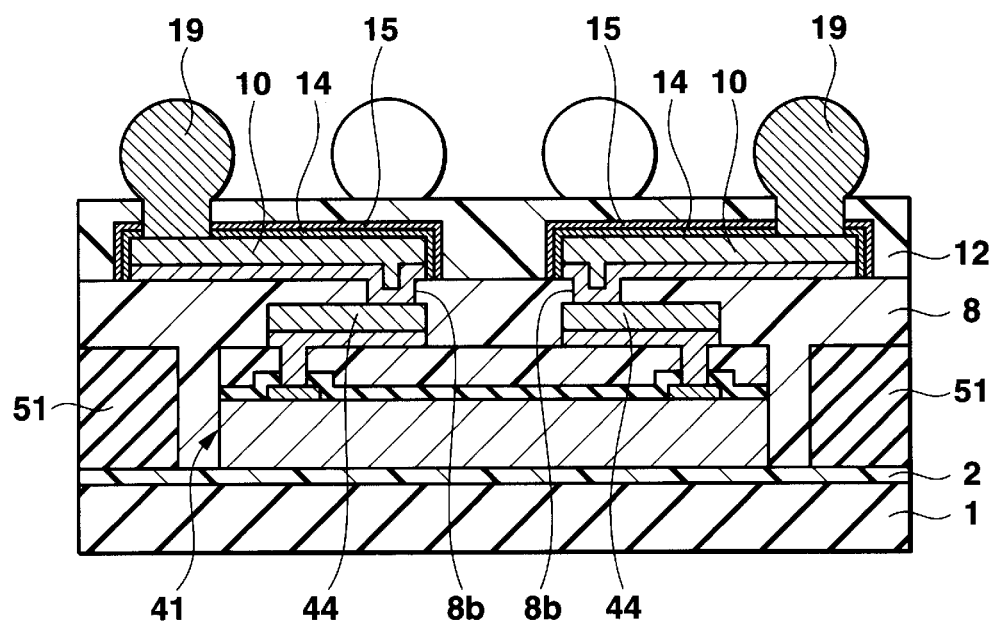
FIG. 27 is a sectional view of a semiconductor device according to the eighth embodiment of the present invention.

FIG. 27 is a sectional view of a semiconductor device according to the eighth embodiment of the present invention. This semiconductor device differs from the semiconductor device shown in FIG. 26 in that a semiconductor structure 41 having no lower encapsulating layer 46 is used, and a square frame-like buried member 51 having substantially the same thickness as the semiconductor structure 41 is formed on the upper surface of an adhesive layer 2 around the semiconductor structure 41.

Figure 28:
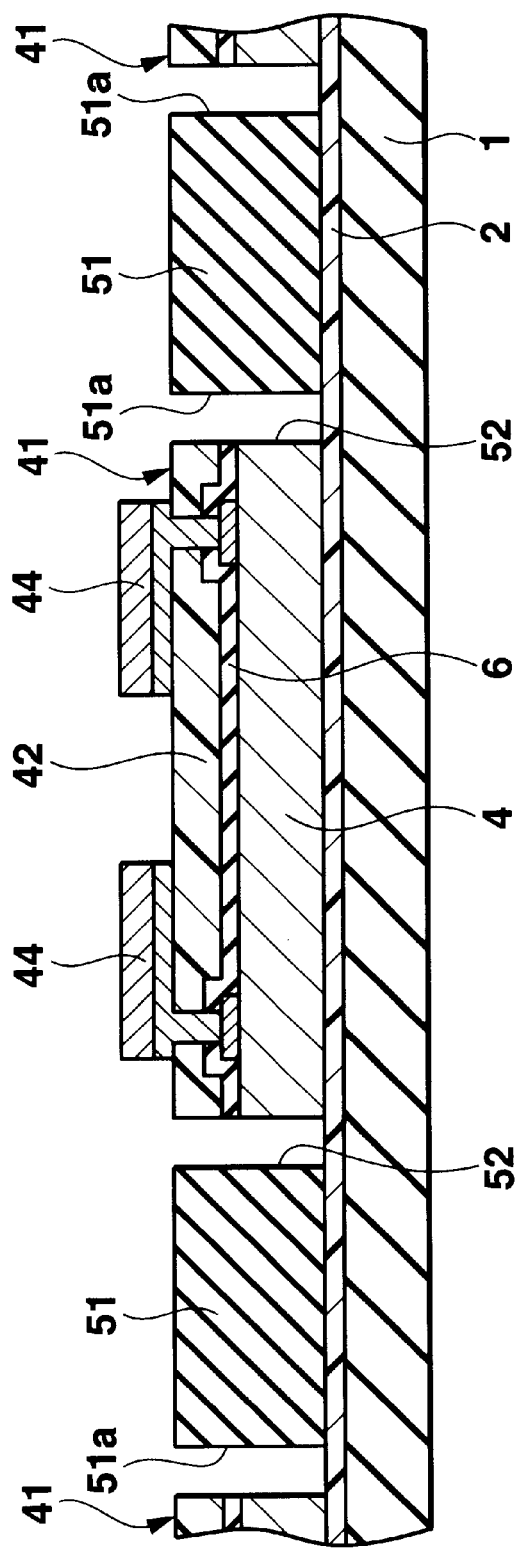
FIG. 28 is a sectional view of an initial fabrication step in the fabrication of the semiconductor device shown in FIG. 27.

An example of a method of fabricating the semiconductor device of this embodiment will be explained below. First, as shown in FIG. 28, the lower surface of a lattice-like buried member 51 is adhered to a predetermined portion of the upper surface of an adhesive layer 2 formed on the entire upper surface of a large base plate from which a plurality of small base plates 1 shown in FIG. 27 can be obtained. For example, the lattice-like buried member 51 is obtained by forming a plurality of square openings 51a in a matrix manner by, e.g., punching or etching in a sheet-like buried member made of silicon, glass, ceramics, resin, metal, or the like. The lattice-like burrier 51 may also be formed by adhering a sheet-like buried member on the entire upper surface of the adhesive layer 2, and performing spot facing.

Next, the lower surface of a silicon substrate 4 of a semiconductor structure 41 is adhered to a central portion of the upper surface of the adhesive layer 2 in each opening 51a of the lattice-like buried member 51. In this state, the upper surface of the buried member 51 and the upper surface of a protective layer 42 of the semiconductor structure 41 are positioned on substantially the same level. Also, a relatively narrow gap 52 is formed between the semiconductor structure 41 and the square frame-like-barrier 51 formed around the semiconductor structure 41.

The thickness of the buried member 51 is substantially the same as the total thickness of the silicon substrate 4, an insulating layer 6, and the protective layer 42. However, the thickness of the buried member 51 may also be substantially the same as the thickness of the silicon substrate 4, the total thickness of the silicon substrate 4 and insulting layer 6, or a thickness including the thickness of a distributing line 44.

Figure 29:
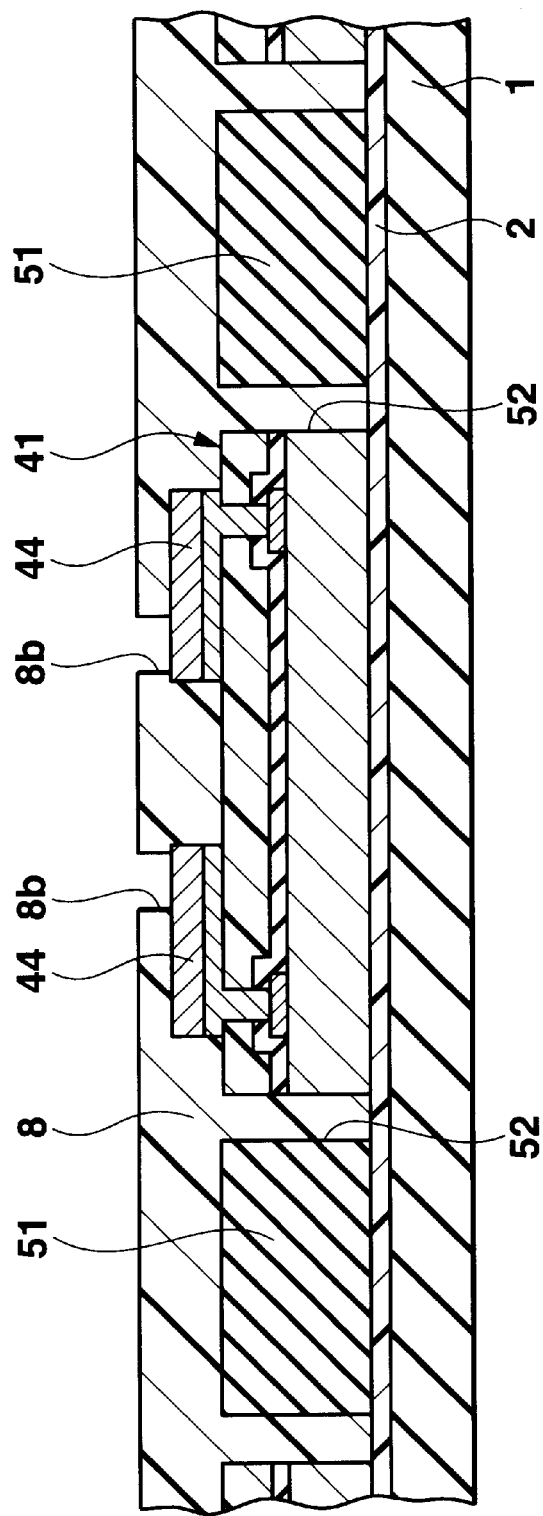
FIG. 29 is a sectional view of a fabrication step following FIG. 28.

Next, as shown in FIG. 29, on the upper surfaces of the semiconductor structure 41 and buried member 51 including the gap 52, a first insulating layer 8 made of, e.g., polyimide or an epoxy-based resin is so formed as to have a thickness slightly larger than the total height of the semiconductor structure 41 and distributing lines 44. If necessary, the upper surface of the first insulating layer 8 is smoothened by appropriately polishing it. Holes 8b are formed in those portions of the first insulating layer 8, which correspond to connecting pad portions of the distributing lines 44, by photolithography or $CO_2$ laser irradiation.

Figure 30:
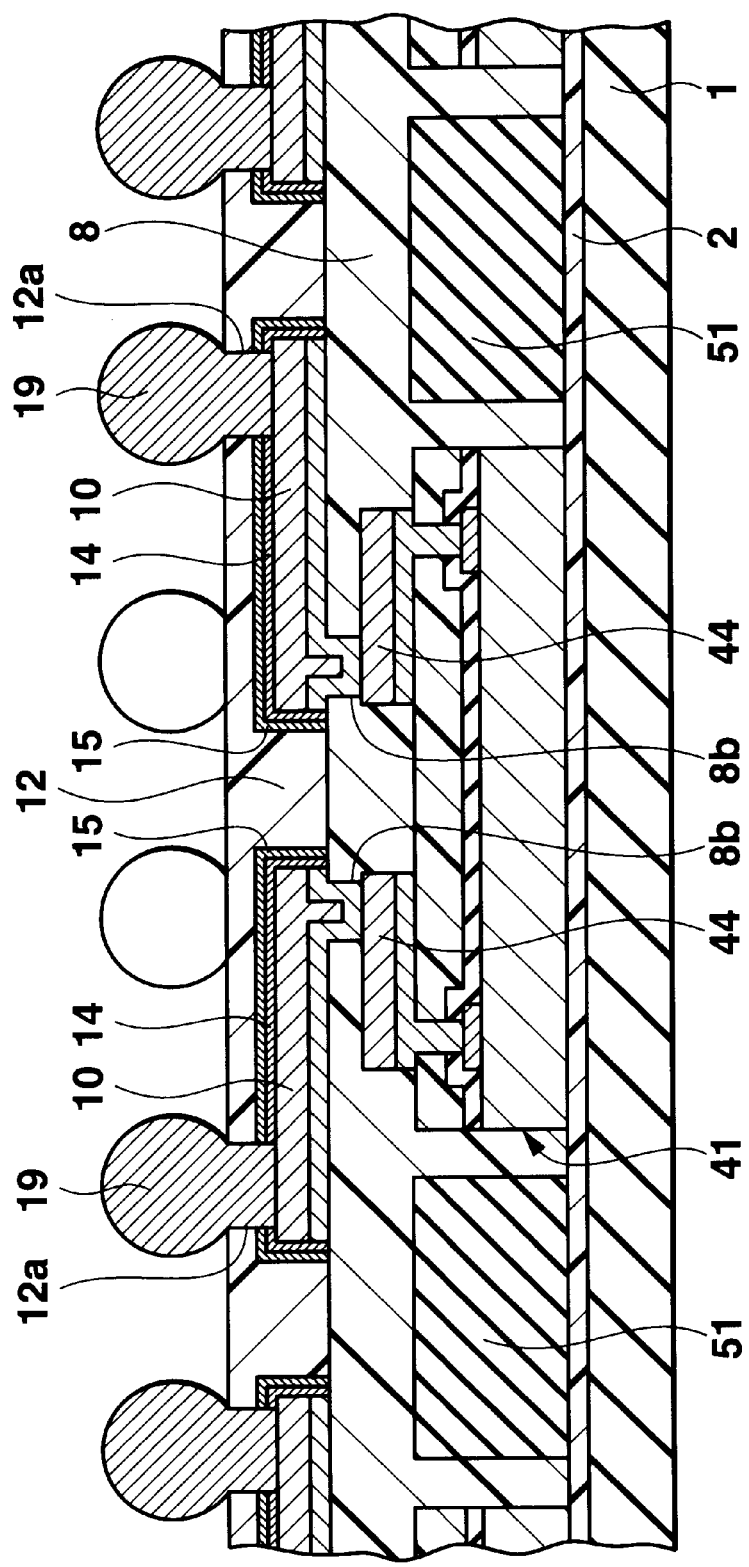
FIG. 30 is a sectional view of a fabrication step following FIG. 29.

As shown in FIG. 30, as can be readily understood from the fabrication method according to the first embodiment, first upper distributing lines 10 are formed on predetermined portions of the upper surface of the first insulating layer 8 and on the upper surfaces of connecting pad portions of the distributing lines 44 exposed through the holes 8b. Cupric oxide layers 14 and cuprous oxide layers 15 are formed in this order on the surfaces of the first upper distributing lines 10 except for their connecting pad portions. A second insulating layer 12 having holes 12a is formed, and solder balls 19 are formed. After that, the two insulating layers 12 and 8, buried member 51, adhesive layer 2, and base plate 1 are cut between adjacent semiconductor structures 41 to obtain a plurality of semiconductor devices shown in FIG. 27.

In this semiconductor device as shown in FIG. 29, the relatively narrow gap 52 is formed between the semiconductor structure 41 and the square frame-like buried member 51 formed around the semiconductor structure 41, and the first insulating layer 8 made of, e.g., polyimide or an epoxy-based resin is formed in this gap 52. Accordingly, the amount of the first insulting layer 8 can be reduced by the volume of the buried member 51, compared to a structure having no barrier 51. This makes it possible to decrease the stress caused by shrinkage upon curing of the first insulating layer 8 made of, e.g., polyimide or an epoxy-based resin, so the base plate 1 does not easily warp.

(Ninth Embodiment)

Figure 31:
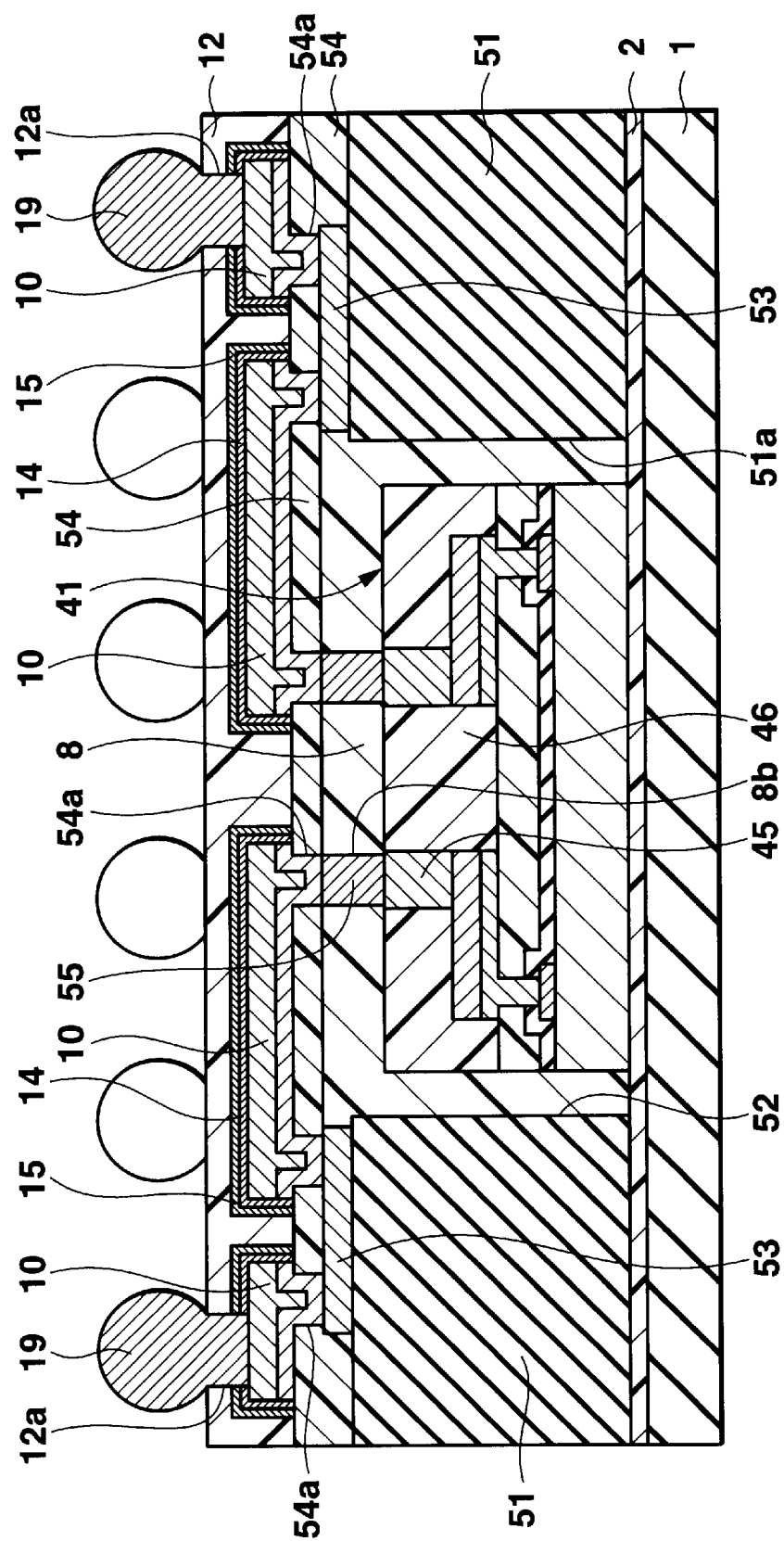
FIG. 31 is a sectional view of a semiconductor device according to the ninth embodiment of the present invention.

FIG. 31 is a sectional view of a semiconductor device according to the ninth embodiment of the present invention. Large differences of this semiconductor device from the semiconductor device shown in FIG. 27 are that a semiconductor structure 41 having columnar electrodes 45 and a lower encapsulating layer 46 is used, the thickness of an insulating buried member 51 is slightly larger than that of the semiconductor structure 41, intermediate distributing lines 53 are formed on the upper surface of the barrier 51, and an intermediate insulating layer 54 is formed on the upper surface of the member 51 including the intermediate distributing lines 53 and on the upper surface of a first insulating layer 8.

The columnar electrodes 45 are connected to first upper distributing lines 10 partially embedded in holes 54a formed in the intermediate insulating layer 54 by conductive materials 55 such as a conductive resin filled in holes 8b formed in the first insulating layer 8. Also, the two end portions of each intermediate distributing line 53 are connected to the first upper distributing lines 10 through the holes 54a formed in the intermediate insulating layer 54.

An example of a method of fabricating the semiconductor device of this embodiment will be explained below. First, the lower surface of a lattice-like buried member 51 is adhered to predetermined portions of the upper surface of an adhesive layer 2 formed on the entire upper surface of a large base plate from which a plurality of small base plates 1 shown in FIG. 31 can be obtained. Intermediate distributing lines 53 made of a copper foil or the like are formed beforehand on predetermined portions of the upper surface of the insulating buried member 51.

Next, the lower surface of a silicon substrate 4 of a semiconductor structure 41 is adhered to a central portion of the upper surface of the adhesive layer 2 in each opening 51a of the lattice-like buried material 51. In this state, the upper surface of the lattice barrier 51 is slightly higher than the upper surface of a lower encapsulating layer 46 of the semiconductor structure 41. A relatively narrow gap 52 is formed between the semiconductor structure 41 and the square frame-like barrier 51 formed outside the semiconductor structure 41.

On the upper surface of the semiconductor structure 41 including the gap 52 and on the upper surface of that portion of the buried member 51, which is close to the gap 52, a first insulating layer 8 made of, e.g., polyimide or an epoxy-based resin is so formed as to be slightly higher than the intermediate distributing lines 53 by using a metal mask or the like or by screen printing. That portion of the uncured first insulating layer 8, which is raised to be higher than the upper surfaces of the intermediate distributing lines 53 is removed by buffing. In this manner, the upper surface of the first insulating layer 8 is substantially leveled with the upper surfaces of the intermediate distributing lines 53, thereby substantially planarizing the whole upper surface. After that, the first insulating layer 8 is cured.

This polishing is performed to remove that portion of the uncured first insulating layer 8, which is raised to be higher than the upper surfaces of the intermediate distributing lines 53, so an inexpensive, low-accuracy buff can be used. Note that the first insulating layer 8 after coating may also be temporarily cured by ultraviolet irradiation or heating in order to prevent excess polishing of the uncured first insulating layer 8 formed in the gap 52 and decrease the cure shrinkage of the first insulating layer 8. If planarization is insufficient because the cure shrinkage of the first insulating layer 8 formed in the gap 52 is too large, coating and polishing of the encapsulating resin can be repeated.

As another example of polishing, it is also possible to flatten a portion of an inexpensive, low-accuracy endless polishing belt, and polish and smoothen, by this flattened portion, that portion of the uncured or temporarily cured first insulating layer 8, which is raised to be higher than the upper surfaces of the intermediate distributing lines 53, by using these upper surfaces of the intermediate distributing lines 53 as polishing limiting surfaces.

Subsequently, holes 8b are formed in those portions of the first insulating layer 8, which correspond to columnar electrodes 45, by photolithography or $CO_2$ laser irradiation. The holes 8b are filled with conductive materials 55 such as conductive resins. An intermediate insulating layer 54 made of, e.g., polyimide or an epoxy-based resin is formed by patterning on the upper surface of the first insulating layer 8 including the conductive material 55 and on the upper surface of the buried member 51 including the intermediate distributing lines 53. In this state, holes 54a are formed in those portions of the intermediate insulating layer 54, which correspond to the two end portions of each intermediate distributing line 53 and to the conductive materials 55.

As can be readily understood from the fabrication method according to the first embodiment described earlier, first upper distributing lines 10 are formed on the two end portions of each intermediate distributing line 53 exposed through the holes 54a, on the upper surface of each conductive material 55, and on predetermined portions of the upper surface of the intermediate insulating layer 54. Cupric oxide layers 14 and cuprous oxide layers 15 are formed in this order on the surfaces of the first upper distributing lines 10 except for their connecting pad portions. Then, a second insulating layer 12 having holes 12a is formed, and solder balls 19 are formed. Finally, the two insulating layers 12 and 54, buried material 51, adhesive layer 2, and base plate 1 are cut between adjacent semiconductor structures 41 to obtain a plurality of semiconductor devices shown in FIG. 31.

(10th Embodiment)

In each of the first to ninth embodiments, copper oxide layers are formed only in distributing lines. However, it is also possible to form copper projecting electrodes on distributing lines and form copper oxide layers in both the distributing lines and projecting electrodes. The 10th embodiment shown in FIG. 32 is this embodiment.

Figure 32:
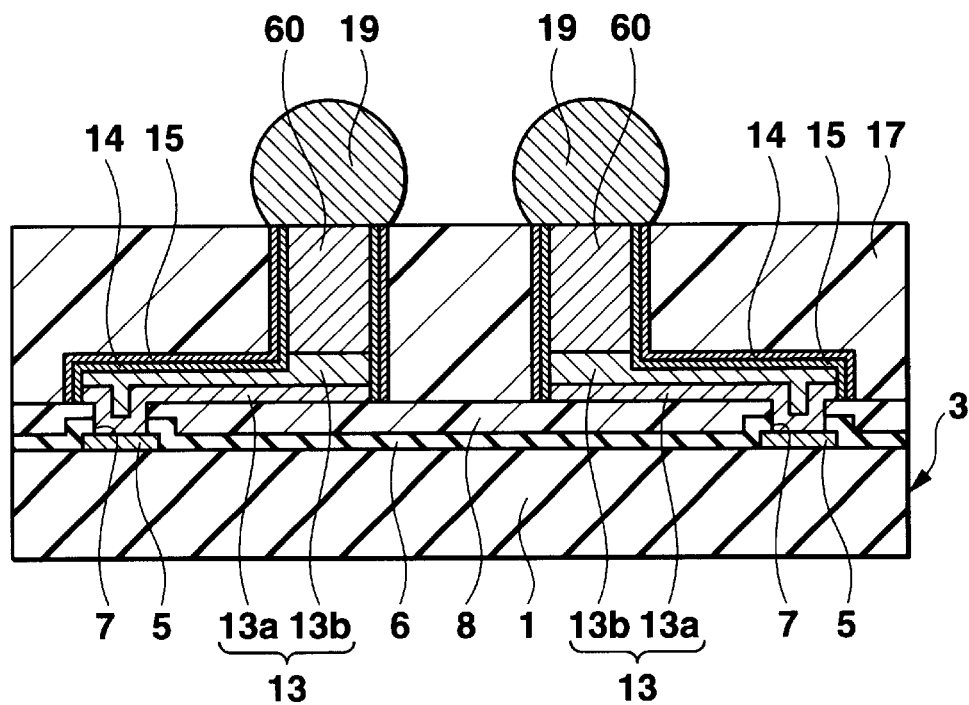
FIG. 32 is a sectional view of a semiconductor device according to the 10th embodiment of the present invention.

On a first insulating layer 8 formed on a semiconductor structure 3 shown in FIG. 32, distributing lines 13 each made up of a metal undercoating 13a and upper metal layer 13b are formed. Each distributing line extends from a connecting pad 5 in a peripheral portion of the semiconductor structure 3 to a central portion of the semiconductor structure 3. A connecting pad portion is formed at one end on an integrated circuit portion (not shown), and a columnar projecting electrode 60 made of copper is formed on this connecting pad portion. A cupric oxide layer 14 is formed on the side surfaces of a copper layer of the metal undercoating 13a, on the surface of the upper metal layer 13b, and on the outer peripheral surface of the columnar projecting electrode 60, and a cuprous oxide layer 15 is formed on the surface of the cupric oxide layer 14. No oxide layer is formed on the upper surface of the columnar projecting electrode 60, so this upper surface is leveled with the upper surface of an insulating layer 17. To fabricate a semiconductor device having this structure, columnar projecting electrodes 60 are formed on connecting pad portions of distributing lines 13 by electroplating or the like. After that, a metal undercoating 13a is patterned into the same shape as the upper metal layer 13b, and cupric oxide layer 14 and cuprous oxide layer 15 are formed on the entire surface including the upper surfaces of the distributing lines 13 and projecting electrodes 60. Then, an insulating layer 17 is once formed on an insulating layer 8 so as to have a thickness larger than the height of the projecting electrodes 60. The cupric oxide layer 14 and cuprous oxide layer 15 on the upper surface of the insulating layer 8 and the peripheral surface of the projecting electrodes 60 are removed by polishing. In this way, the upper surface of the insulating layer 8 is leveled with the upper surfaces of the projecting electrodes 60. After that, a solder ball 19 is mounted on the upper surface of each projecting electrode 60.

In the semiconductor device according to the 10th embodiment, the connecting pad portion of the distributing line 13 is formed on the integrated circuit portion of the semiconductor structure 3. Since no insulating layer need be formed in the peripheral portion of the semiconductor structure 3, the planar size can be decreased. Accordingly, when this embodiment is applied to a semiconductor structure having only a few connecting pads, the semiconductor device can be further downsized.

(Still Another Embodiment)

For example, the base plate and the like shown in FIG. 13 are cut between the adjacent semiconductor structures 3. However, it is also possible to cut the base plate and the like for each set of two or more semiconductor structures 3, e.g., each set of three semiconductor structures 3, thereby obtaining a multi-chip module type semiconductor device. In this embodiment, the three semiconductor structures 3 making one set can be the same or different.

In the present invention, as has been described above, a cupric oxide layer and cuprous oxide layer are formed in this order on the surface except for a connecting pad portion of an uppermost distributing line made of copper. Therefore, compared to a structure in which an uppermost copper distributing line is directly covered with an overcoat layer, the adhesion between the uppermost distributing line and the overcoat layer can be increased, so the humidity resistance can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor structure including a semiconductor substrate having an integrated circuit portion, and a plurality of connecting pads connected to the integrated circuit portion;
    a plurality of distributing lines formed on the semiconductor structure, connected to the connecting pads, and having connecting pad portions;
    an encapsulating layer made of a resin, and formed on the semiconductor structure and upper surface of the distributing lines; and
    a copper oxide layer formed on a surface of each of the distributing lines except for at least the connecting pad portions.

2. The semiconductor device according to claim 1, in which the copper oxide layer is made of cupric oxide.

3. The semiconductor device according to claim 1, in which the copper oxide layer contains a cupric copper layer and cuprous copper layer.

4. The semiconductor device according to claim 1, which further includes a projecting electrode formed on the connecting pad portion of each of the distributing lines.

5. The semiconductor device according to claim 4, which further includes another copper oxide layer formed on an outer surface of the projecting electrode at least except for an upper surface thereof.

6. The semiconductor device according to claim 5, in which at least one of the copper oxide layers contains a cupric copper layer and cuprous copper layer.

7. The semiconductor device according to claim 1, in which the encapsulating layer has a hole for exposing the connecting pad portion of each of the distributing lines, and which further includes a low-melting metal layer formed on the connecting pad portion in the hole.

8. The semiconductor device according to claim 1, in which each of the distributing lines has the connecting pad portion in a central portion of the semiconductor structure.

9. The semiconductor device according to claim 1, which further includes a lower insulating layer formed on side surfaces of the semiconductor structure, and in which the connecting pad portion of at least one of the distributing lines is formed in a region corresponding to the lower insulating layer.

10. The semiconductor device according to claim 1, which further includes a buried member in which the semiconductor structure is positioned.

11. The semiconductor device according to claim 1, which further includes a base plate which has a larger area than the semiconductor structure and supports the semiconductor structure.

12. The semiconductor device according to claim 11, which further includes, on side surfaces of the semiconductor structure, a lower insulating layer formed on the base plate.

13. The semiconductor device according to claim 11, which further includes a buried member supported by the base plate, and enclosing of the semiconductor structure.

14. The semiconductor device according to claim 13, which further includes a gap between side surfaces of the semiconductor structure and the buried member.

15. The semiconductor device according to claim 14, which further includes a lower insulating layer formed in the gap between the side surfaces of the semiconductor structure and the buried material.

16. The semiconductor device according to claim 1, in which the semiconductor structure further includes an insulating layer formed on the semiconductor substrate and having a hole for exposing the connecting pad.

17. The semiconductor device according to claim 16, which further includes a lower insulating layer formed on an upper surface and side surfaces of the semiconductor structure and having a flat upper surface, and in which the connecting pad portion of at least one of the distributing lines is formed in a region corresponding to the lower insulating layer.

18. The semiconductor device according to claim 1, in which the semiconductor structure includes a protective layer formed on the semiconductor substrate and having a hole for exposing the connecting pad, and which further includes a lower distributing line formed on the protective layer.

19. The semiconductor device according to claim 18, which further includes a buried member enclosing side surfaces of the semiconductor structure.

20. The semiconductor device according to claim 19, which further includes a gap between the side surfaces of the semiconductor structure and the buried member.

21. The semiconductor device according to claim 20, which further includes a lower insulating layer formed in the gap between the side surfaces of the semiconductor structure and the buried member.

22. The semiconductor device according to claim 21, in which the buried member has substantially the same thickness as the semiconductor structure.

23. The semiconductor device according to claim 1, in which the semiconductor structure further includes a protective layer formed on the semiconductor substrate and having holes for exposing the connecting pads, lower distributing lines formed on the protective layer and connected to the connecting pads, a columnar electrode formed on one end portion of each of the lower distributing lines, and a lower encapsulating layer formed on a portion of the semiconductor substrate, which includes upper surfaces of the lower distributing lines, between the columnar electrodes.

24. The semiconductor device according to claim 23, which further includes a side insulating layer formed around the semiconductor structure.

25. The semiconductor device according to claim 24, in which the connecting pad portion of at least one of the distributing lines is formed in a region corresponding to the lower insulating layer.

26. The semiconductor device according to claim 23, which further includes a buried member enclosing side surfaces of the semiconductor structure.

27. The semiconductor device according to claim 26, which further includes a gap between the side surfaces of the semiconductor structure and the buried member.

28. The semiconductor device according to claim 27, which further includes a lower insulating layer formed in the gap between the side surfaces of the semiconductor structure and the buried member.

29. The semiconductor device according to claim 26, in which the buried member has a thickness larger than that of the semiconductor structure.

30. The semiconductor device according to claim 1, in which the semiconductor structure further includes a protective layer formed on the semiconductor substrate and having holes for exposing the connecting pads, lower distributing lines formed on the protective layer, connected to the connecting pads, and having connecting pad portions in a region corresponding to the integrated circuit portion, and a lower encapsulating layer having holes for exposing the connecting pad portions and formed on the protective layer including upper surfaces of the lower distributing lines.

31. The semiconductor device according to claim 30, which further includes a lower insulating layer formed on a side of side surfaces of the semiconductor structure.

32. The semiconductor device according to claim 31, in which the connecting pad portion of at least one of the distributing lines is formed in a region corresponding to the lower insulating layer.

33. A fabrication method of a semiconductor device comprising:

preparing a semiconductor structure including a semiconductor substrate having an integrated circuit portion, and a plurality of connecting pads connected to the integrated circuit portion;

forming, on the semiconductor structure, a plurality of distributing lines connected to the connecting pads and having connecting pad portions;

forming a copper oxide layer on a surface except for at least the connecting pad portions of the distributing lines; and forming an encapsulating layer made of a resin on the semiconductor structure including upper surfaces of the distributing lines.

34. The formation method according to claim 33, in which the forming the copper oxide layer includes an annealing process.

35. The fabrication method according to claim 33, in which the forming the copper oxide layer includes forming a cupric oxide layer and cuprous oxide layer in this order on a surface of each distributing line.

36. The fabrication method according to claim 35, in which the forming the cupric oxide layer and cuprous oxide layer includes a dipping process using a processing solution.

37. The fabrication method according to claim 36, in which the processing solution is a solution mixture of a first processing solution containing sodium hydroxide and a second processing solution containing sodium chlorite.

38. The fabrication method according to claim 37, in which the first processing solution contains about 10 to 20 wt % of sodium hydroxide, and the second processing solution contains about 15 to 25 wt % of sodium chlorite.

39. The fabrication method according to claim 37, in which a time of the dipping process is a few min.

40. A fabrication method of a semiconductor device comprising:

arranging a plurality of semiconductor structures with intervals therebetween on a base plate, the semiconductor structures having external connecting portions on upper surfaces thereof;

forming a surrounding portion outside side surfaces of each of said semiconductor structures on the base plate;

forming, on at least the surrounding portion, uppermost distributing lines made of copper each of which has a connecting pad portion and is connected to a corresponding external connecting portion of one of the semiconductor structures, such that at least one connecting pad portion is formed on the surrounding portion;

forming a cupric oxide layer and cuprous oxide layer in this order on a surface of the uppermost distributing line except for at least the connecting pad portion thereof;

covering a region of the uppermost distributing line except for the connecting pad potion thereof with an encapsulating layer; and cutting the encapsulating layer and surrounding portion between the semiconductor structures to obtain a plurality of semiconductor devices having at least one semiconductor structure in which the connecting pad portion of at least one of the uppermost distributing lines is formed on the surrounding portion in a region outside the semiconductor structure.

41. The fabrication method according to claim 40, in which the cupric oxide layer and cuprous oxide layer are formed by a dipping process using a processing solution.

42. The fabrication method according to claim 41, in which the processing solution is a solution mixture of a first processing solution containing sodium hydroxide and a second processing solution containing sodium chlorite.

43. The fabrication method according to claim 42, in which the first processing solution contains about 10 to 20 wt % of sodium hydroxide, and the second processing solution contains about 15 to 25 wt % of sodium chlorite.

44. The fabrication method according to claim 43, in which a time of the dipping process is about 1 min.

45. The fabrication method according to claim 40, in which the cutting comprises performing cutting such that a plurality of semiconductor structures are included.

46. The fabrication method according to claim 40, in which the forming the surrounding portion includes forming a buried member between the semiconductor structures.

47. The fabrication method according to claim 40, which further includes cutting the encapsulating layer and surrounding portion and also cutting the base plate.

48. The fabrication method according to claim 40, which further includes placing another base plate below the base plate before the base plate is cut, and removing said another base plate after the base plate is cut.

49. The fabrication method according to claim 40, which further includes removing the base plate, before the step of cutting the encapsulating layer and surrounding portion.

50. The fabrication method according to claim 49, which further includes thinning a semiconductor substrate of the semiconductor structure, following the step of removing the base plate.

51. The fabrication method according to claim 40, which further includes forming a solder ball on the connecting pad portion of the uppermost distributing line.

* * * * *